(12) United States Patent
Tanaka

(10) Patent No.: US 11,545,220 B2
(45) Date of Patent: Jan. 3, 2023

(54) SPLIT-GATE MEMORY CELLS

(71) Applicant: MICRON TECHNOLOGY, INC., Boise, ID (US)

(72) Inventor: Tomoharu Tanaka, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 15 days.

(21) Appl. No.: 17/351,347

(22) Filed: Jun. 18, 2021

(65) Prior Publication Data
US 2022/0208268 A1    Jun. 30, 2022

Related U.S. Application Data

(60) Provisional application No. 63/131,340, filed on Dec. 29, 2020.

(51) Int. Cl.
| | | |
|---|---|---|
| G11C 16/34 | (2006.01) | |
| G11C 16/04 | (2006.01) | |
| G11C 16/26 | (2006.01) | |
| G11C 16/30 | (2006.01) | |
| G11C 16/14 | (2006.01) | |

(52) U.S. Cl.
CPC ........ *G11C 16/0483* (2013.01); *G11C 16/045* (2013.01); *G11C 16/14* (2013.01); *G11C 16/26* (2013.01); *G11C 16/30* (2013.01); *G11C 16/3404* (2013.01)

(58) Field of Classification Search
CPC ... G11C 16/0483; G11C 16/045; G11C 16/14; G11C 16/26; G11C 16/30; G11C 16/3404; G11C 16/08; G11C 16/24; G11C 16/10; G11C 16/16; G11C 16/3459; G11C 16/0425; H01L 27/115
USPC ........................................ 365/185.17, 185.24
See application file for complete search history.

(56) References Cited

U.S. PATENT DOCUMENTS

| | | | |
|---|---|---|---|
| 5,748,538 A * | 5/1998 | Lee ..................... | G11C 16/0491 257/E27.103 |
| 6,584,034 B1 * | 6/2003 | Hsu ......................... | G11C 8/12 365/189.04 |
| 7,075,823 B2 | 7/2006 | Harari | |
| 7,838,920 B2 | 11/2010 | Ghodsi | |
| 7,906,818 B2 | 3/2011 | Pekny | |
| 9,761,310 B2 * | 9/2017 | Hsu ......................... | G11C 16/10 |
| 2005/0017287 A1 * | 1/2005 | Chih .................. | G11C 16/0433 257/314 |
| 2009/0073771 A1 * | 3/2009 | Li ....................... | G11C 16/3454 365/185.22 |

(Continued)

*Primary Examiner* — Michael T Tran
(74) *Attorney, Agent, or Firm* — Dicke, Billig & Czaja, PLLC

(57) ABSTRACT

Memory might include an array of memory cells having a plurality of strings of series-connected split-gate memory cells each including a primary memory cell portion and an assist memory cell portion, a plurality of primary access lines each connected to a control gate of the primary memory cell portion of a respective split-gate memory cell of each string of series-connected split-gate memory cells of the plurality of strings of series-connected split-gate memory cells, and a plurality of assist access lines each connected to a control gate of the assist memory cell portion of its respective split-gate memory cell of each string of series-connected split-gate memory cells of the plurality of strings of series-connected split-gate memory cells.

21 Claims, 13 Drawing Sheets

(56) References Cited

U.S. PATENT DOCUMENTS

| | | | |
|---|---|---|---|
| 2013/0146960 A1* | 6/2013 | Sakui | H01L 27/11582 257/314 |
| 2016/0035424 A1* | 2/2016 | Chang | G11C 16/0483 365/185.17 |
| 2020/0065270 A1* | 2/2020 | Mobin | H01L 23/645 |

* cited by examiner

SPLIT-GATE MEMORY CELLS

This application claims the benefit of U.S. Provisional Application No. 63/131,340, filed on Dec. 29, 2020, hereby incorporated herein in its entirety by reference.

TECHNICAL FIELD

The present disclosure relates generally to integrated circuits, and, in particular, in one or more embodiments, the present disclosure relates to apparatus including split-gate memory cells, and methods of their operation.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In programming memory, memory cells might be programmed as what are often termed single-level cells (SLC). SLC may use a single memory cell to represent one digit (e.g., one bit) of data. For example, in SLC, a Vt of 2.5V or higher might indicate a programmed memory cell (e.g., representing a logical 0) while a Vt of −0.5V or lower might indicate an erased memory cell (e.g., representing a logical 1). Such memory might achieve higher levels of storage capacity by including multi-level cells (MLC), triple-level cells (TLC), quad-level cells (QLC), etc., or combinations thereof in which the memory cell has multiple levels that enable more digits of data to be stored in each memory cell. For example, MLC might be configured to store two digits of data per memory cell represented by four Vt ranges, TLC might be configured to store three digits of data per memory cell represented by eight Vt ranges, QLC might be configured to store four digits of data per memory cell represented by sixteen Vt ranges, and so on.

Sensing (e.g., reading or verifying) a data state of a target memory cell often involves detecting whether the target memory cell is activated in response to a particular voltage level applied to its control gate, such as by detecting whether a data line connected to the target memory cell experiences a change in voltage level caused by current flow through the memory cell. This typically includes applying a voltage level to the control gate of each remaining memory cell of a string of series-connected memory cells containing the target memory cell that is expected to activate each of these remaining memory cells regardless of their data state. Such a voltage level might be referred to as a pass voltage. However, some memory cells may be over programmed, e.g., having a threshold voltage level higher than desired, and may not be activated in response to the pass voltage being applied to their control gate. This can lead to an inaccurate determination of the data state of the target memory cell where the target memory cell might be deemed to be deactivated even if it were activated.

DETAILED DESCRIPTION

Figure 1:
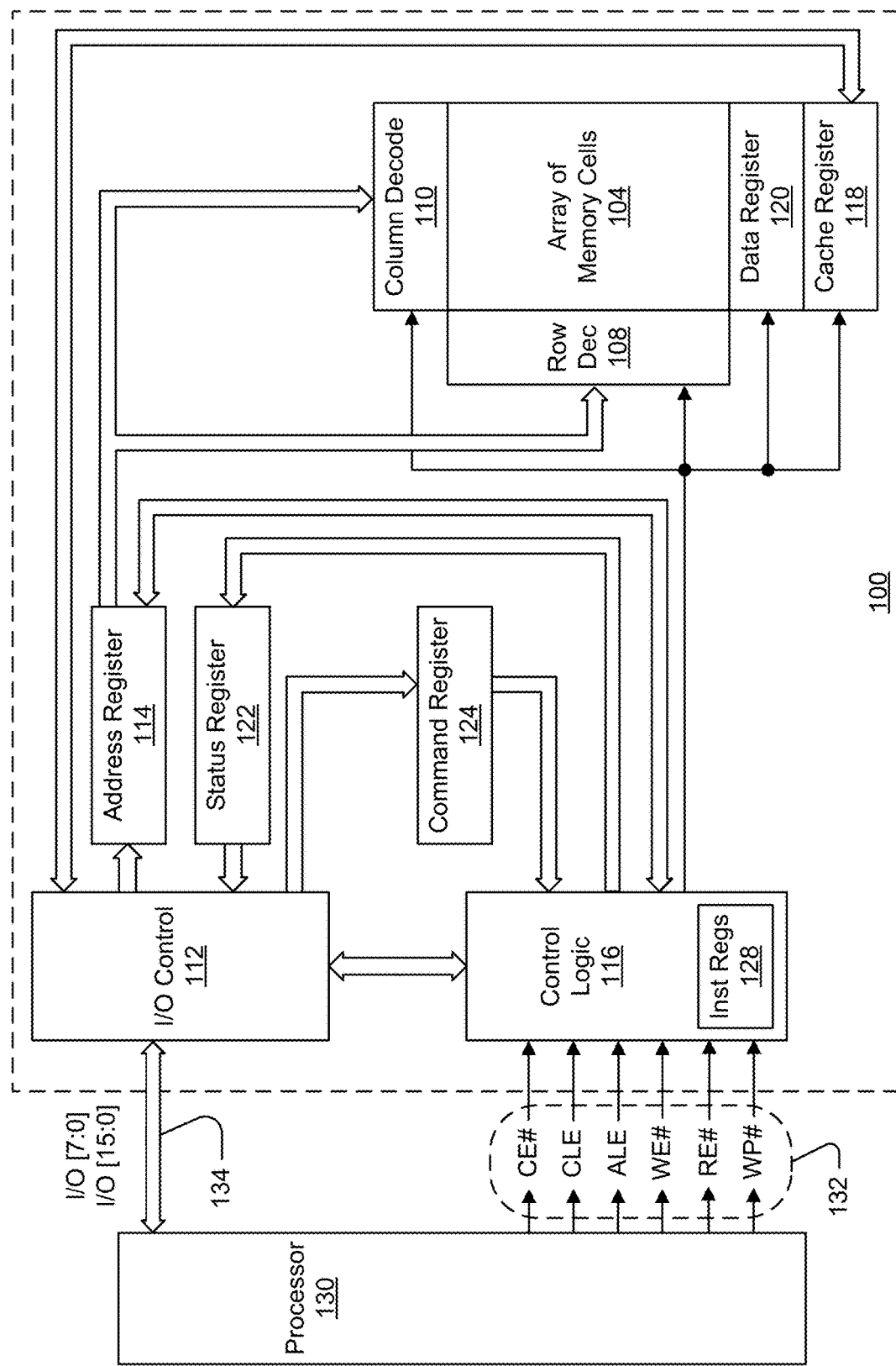
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

Various embodiments disclosed herein include memories having split-gate memory cells, each having a primary memory cell portion and an assist memory cell portion. Data may be written to a primary memory cell portion during a programming operation in response to a write command and its associated data, and may be read from the primary memory cell portion during a read operation in response to a read command for output of that data. The assist memory cell portion may be inaccessible during normal operation of the memory and may store predetermined data, e.g., a predetermined range of threshold voltages. For example, each assist memory cell portion might have a threshold voltage in a predefined range of threshold voltages. As used herein, a read operation, which includes output of read data from the memory, is distinguished from a verify operation, which is utilized during a programming or erase operation to determine whether a memory cell has an intended data state, and does not include output of data from the memory during normal operation.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. The array of memory cells 104 includes strings of series-connected split-gate memory cells in accordance with an embodiment. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

In the example of FIG. 1, a row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and may generate status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE#, a command latch enable CLE, an address latch enable ALE, a write enable WE#, a read enable RE#, and a write protect WP#. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
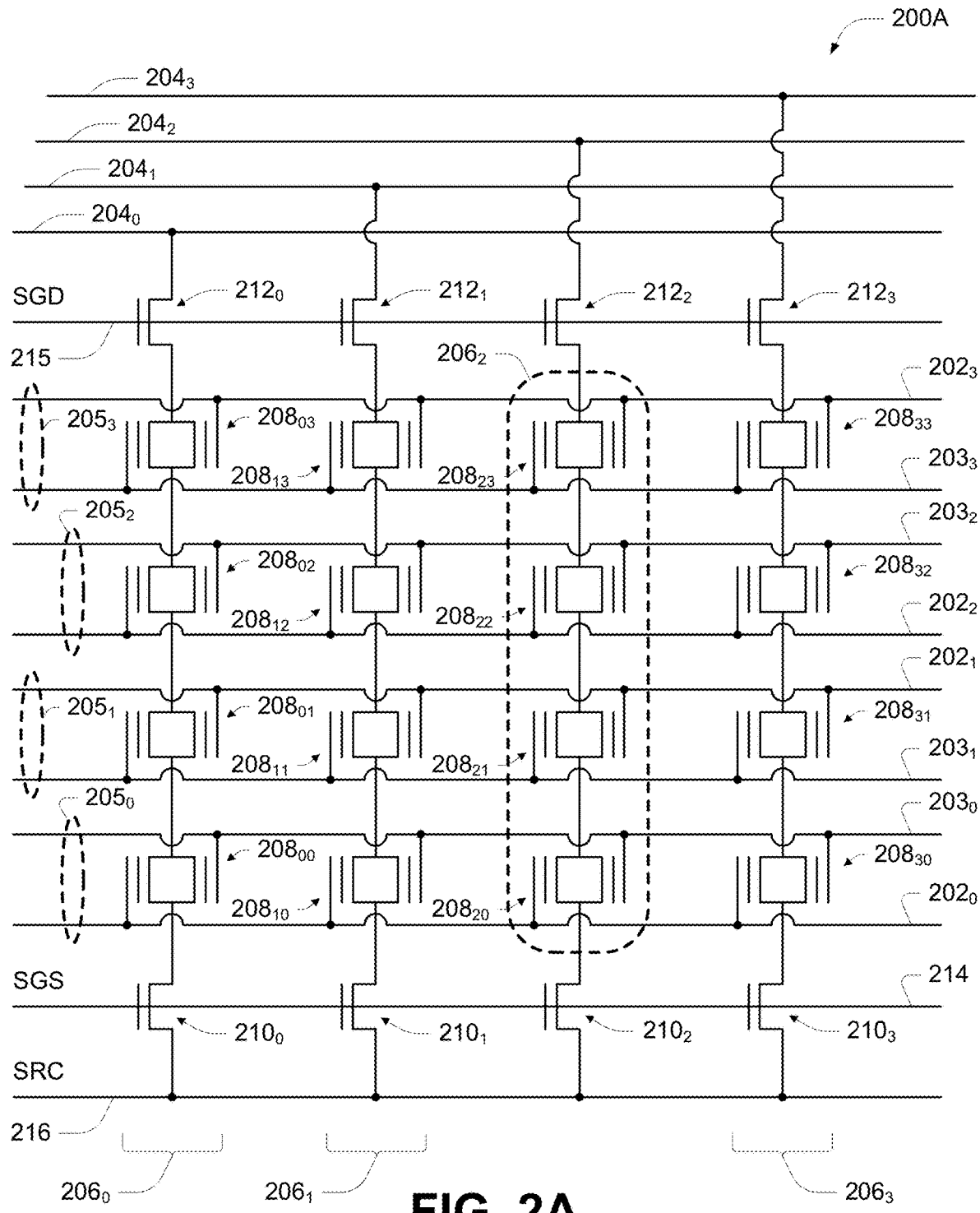
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes primary access lines (e.g., primary word lines) $202_0$ to $202_3$, assist access lines (e.g., assist word lines) $203_0$ to $203_3$, and data lines (e.g., bit lines) $204_0$ to $204_3$. The primary access lines 202 might be connected to global primary access lines (e.g., global primary word lines), not shown in FIG. 2A, in a many-to-one relationship. The assist access lines 202 might be connected to global assist access lines (e.g., global assist word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to a primary access line 202 and corresponding assist access line 203) and columns (each corresponding to a data line 204). Each column might include a string of series-connected split-gate memory cells (e.g., split-gate non-volatile memory cells), and might be referred to as a NAND string 206. A NAND string 206 might be connected (e.g., selectively connected) to a common source (SRC) 216 and might include, in the example of FIG. 2A, memory cells $208_{00}$ to $208_{03}$ for NAND string $206_0$, memory cells $208_{10}$ to $208_{13}$ for NAND string $206_1$, memory cells $208_{20}$ to $208_{23}$ for NAND string $206_2$, or memory cells $208_{30}$ to $208_{33}$ for NAND string $206_3$. The memory cells 208 might represent, and may be referred to as, split-gate memory cells. The memory cells $208_0$ to $208_N$ might include memory cells intended for storage of data, and might further include other memory cells not intended for storage of data, e.g., dummy memory cells. Dummy memory cells are typically not accessible to a user of the memory, and are instead typically incorporated into a NAND string for operational advantages that are well understood.

The memory cells 208 of each NAND string 206 might be connected in series between a select gate 210 (e.g., a field-effect transistor), such as one of the select gates $210_0$ to $210_3$ (e.g., that might be source select transistors, commonly referred to as select gate source), and a select gate 212 (e.g., a field-effect transistor), such as one of the select gates $212_0$ to $212_3$ (e.g., that might be drain select transistors, commonly referred to as select gate drain). Select gates $210_0$ to $210_3$ might be commonly connected to a select line 214, such as a source select line or select gate source (SGS), and select gates $212_0$ to $212_3$ might be commonly connected to a select line 215, such as a drain select line or select gate drain (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell 208 of the corresponding NAND string 206. For example, the drain of select gate $210_0$ might be connected to memory cell $208_{00}$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the data line 204 for the corresponding NAND string 206. For example, the drain of select gate $212_0$ might be connected to the data line $204_0$ for the corresponding NAND string $206_0$. The source of each select gate 212 might be connected to a memory cell 208 of the corresponding NAND string 206. For example, the source of select gate $212_0$ might be connected to memory cell $208_{03}$ of the corresponding NAND string $206_0$. Therefore, each select gate 212 might be configured to selectively connect a corresponding NAND string 206 to the corresponding data line 204. A control gate of each select gate 212 might be connected to select line 215.

The memory array in FIG. 2A might be a quasi-two-dimensional memory array and might have a generally planar structure, e.g., where the common source 216, NAND strings 206 and data lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the data lines 204 that might be substantially parallel to the plane containing the common source 216.

A column of the memory cells 208 might be a NAND string 206 or a plurality of NAND strings 206 selectively connected to a given data line 204. A row of the memory cells 208 might be memory cells 208 commonly connected to a given primary access line 202. A row of memory cells 208 can, but need not, include all memory cells 208 commonly connected to a given primary access line 202. Rows of memory cells 208 might often be divided into one or more groups of physical pages of memory cells 208, and physical pages of memory cells 208 often include every other memory cell 208 commonly connected to a given primary access line 202. For example, memory cells 208 commonly connected to primary access line $202_3$ and selectively connected to even data lines 204 (e.g., data lines $204_0$ and $204_2$) might be one physical page of memory cells 208 (e.g., even memory cells) while memory cells 208 commonly connected to primary access line $202_3$ and selectively connected to odd data lines 204 (e.g., data lines $204_1$ and $204_3$) might be another physical page of memory cells 208 (e.g., odd memory cells). Other groupings of memory cells 208 commonly connected to a given primary access line 202 might also define a physical page of memory cells 208. For certain memory devices, all memory cells commonly connected to a given primary access line might be deemed a physical page of memory cells. The portion of a physical page of memory cells (which, in some embodiments, could still be the entire row) that is read during a single read operation or programmed during a single programming operation. A block of memory cells might include those memory cells that are configured to be erased together, such as all memory cells connected to primary access lines $202_0$-$202_3$ (e.g., all NAND strings 206 sharing common primary access lines 202). Unless expressly distinguished, a reference to a page of memory cells herein refers to the memory cells of a logical page of memory cells. Although the array of memory cells 200A depicts four primary access lines 202, four assist access lines 203, four data lines 204, and four memory cells 208 in each NAND string 206, other lesser or greater numbers of such elements might be used. Similarly, although a number of memory cells 208 in a NAND string 206 would generally be equal to a number of primary access lines 202 and to a number of assist access lines 203 in the array of memory cells 200A, a number of data lines 204 might be independent of the number of memory cells 208 in a NAND string 206, the number of primary access lines 202, and the number of assist access lines 203. A primary access line 202 and its corresponding assist access line 203 might be referred to as an access line pair 205, access line pairs $205_0$-$205_3$.

Figure 2B:
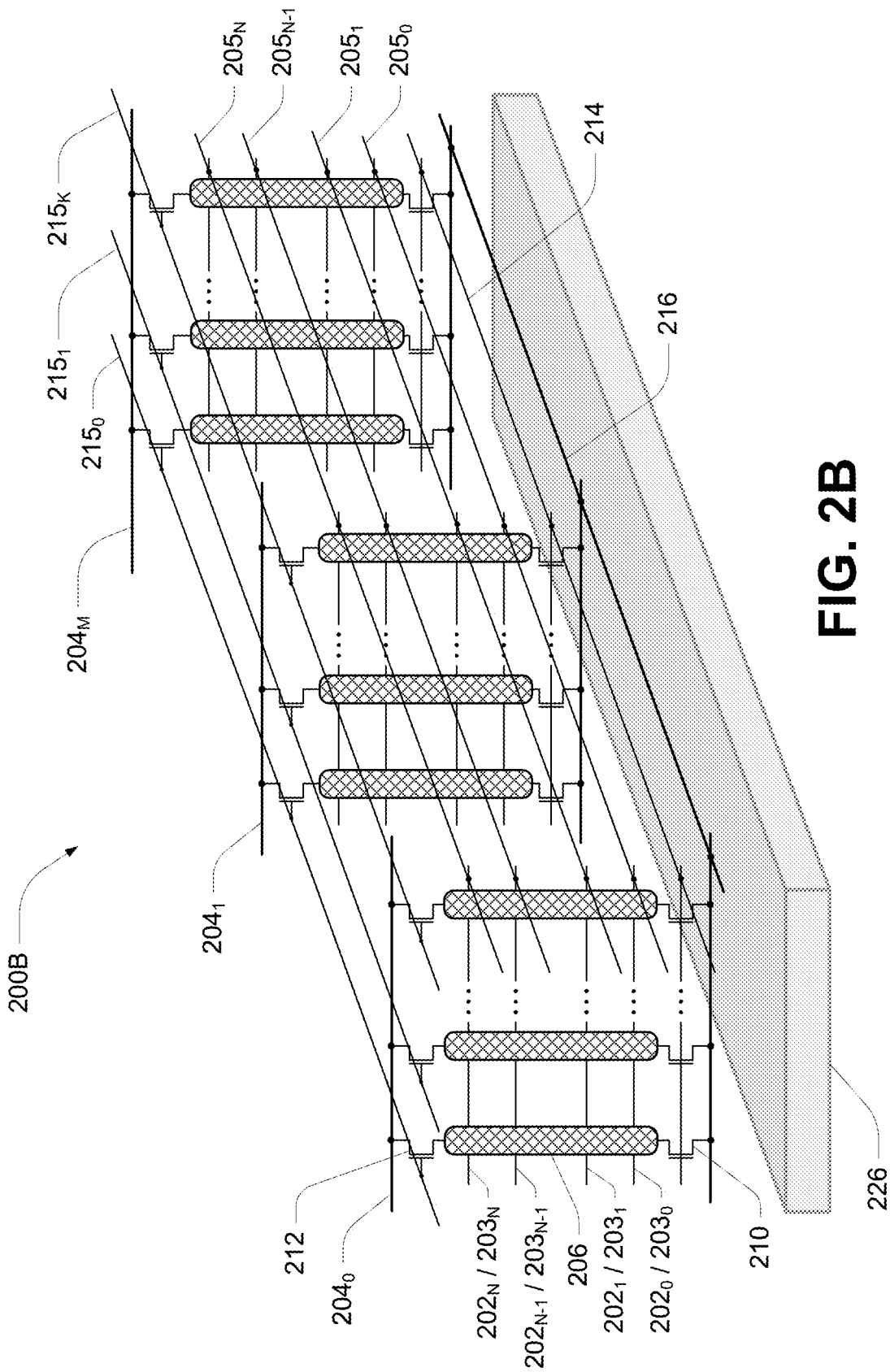

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of both the primary memory cell portion and the assist memory cell portion of the split-gate memory cells of NAND strings 206.

The NAND strings 206 might be each selectively connected to a data line $204_0$-$204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same data line 204. Subsets of NAND strings 206 can be connected to their respective data lines 204 by biasing the select lines $215_0$-$215_K$ to selectively activate particular select transistors 212 each between a NAND string 206 and a data line 204. The select transistors 210 can be activated by biasing the select line 214. Each access line pair 205 (e.g., a primary access line 202 and a corresponding assist access line 203) might be connected to multiple rows of memory cells of the memory array 200B. Rows of split-gate memory cells that are commonly connected to each other by a particular access line pair 205 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
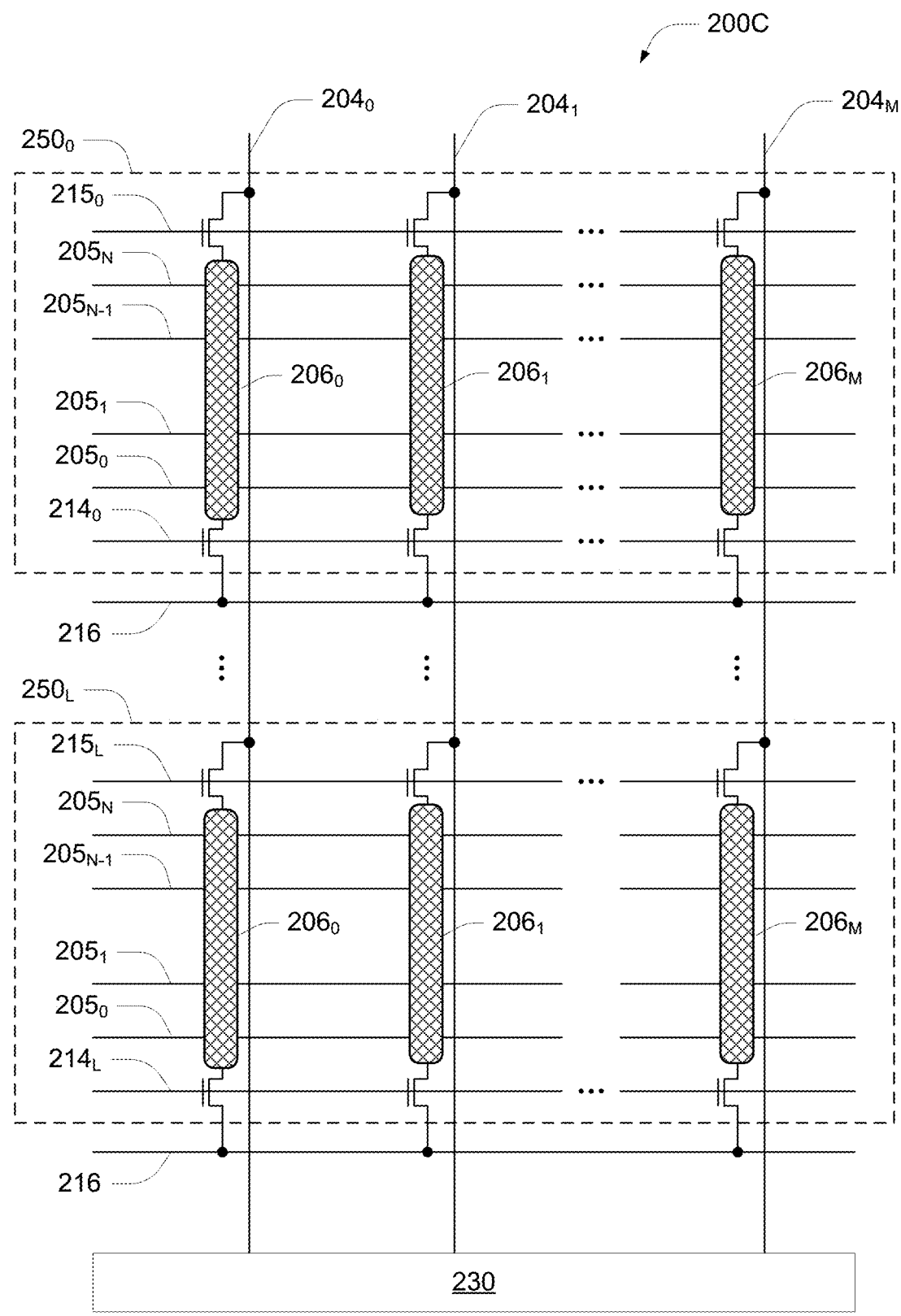

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected split-gate memory cells (e.g., NAND strings) 206, access line pairs (e.g., word line pairs) 205, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250, e.g., blocks of memory cells $250_0$-$250_L$. Blocks of memory cells 250 may be groupings of memory cells 208 that may be erased together in a single erase operation, sometimes referred to as erase blocks. Each block of memory cells 250 might include those NAND strings 206 commonly associated with a single select line 215, e.g., select line 215o. The source 216 for the block of memory cells $250_0$ might be a same source as the source 216 for the block of memory cells $250_L$. For example, each block of memory cells $250_0$-$250_L$ might be commonly selectively connected to the source 216. Access line pairs 205 and select lines 214 and 215 of one block of memory cells 250 may have no direct connection to access line pairs 205 and select lines 214 and 215, respectively, of any other block of memory cells of the blocks of memory cells $250_0$-$250_L$.

The data lines $204_0$-$204_M$ may be connected (e.g., selectively connected) to a buffer portion 230, which might be a portion of a data buffer of the memory. The buffer portion 230 might correspond to a memory plane (e.g., the set of blocks of memory cells $250_0$-$250_L$. The buffer portion 230 might include sense circuits (not shown in FIG. 2C) for sensing data values indicated on respective data lines 204.

While the blocks of memory cells 250 of FIG. 2C depict only one select line 215 per block of memory cells 250, the blocks of memory cells 250 might include those NAND strings 206 commonly associated with more than one select line 215. For example, select line $215_0$ of block of memory cells $250_0$ might correspond to the select line $215_0$ of the memory array 200B of FIG. 2B, and the block of memory cells of the memory array 200C of FIG. 2C might further include those NAND strings 206 associated with select lines $215_1$-$215_K$ of FIG. 2B. In such blocks of memory cells 250 having NAND strings 206 associated with multiple select lines 215, those NAND strings 206 commonly associated with a single select line 215 might be referred to as a sub-block of memory cells. Each such sub-block of memory cells might be selectively connected to the buffer portion 230 responsive to its respective select line 215.

Figure 3A:
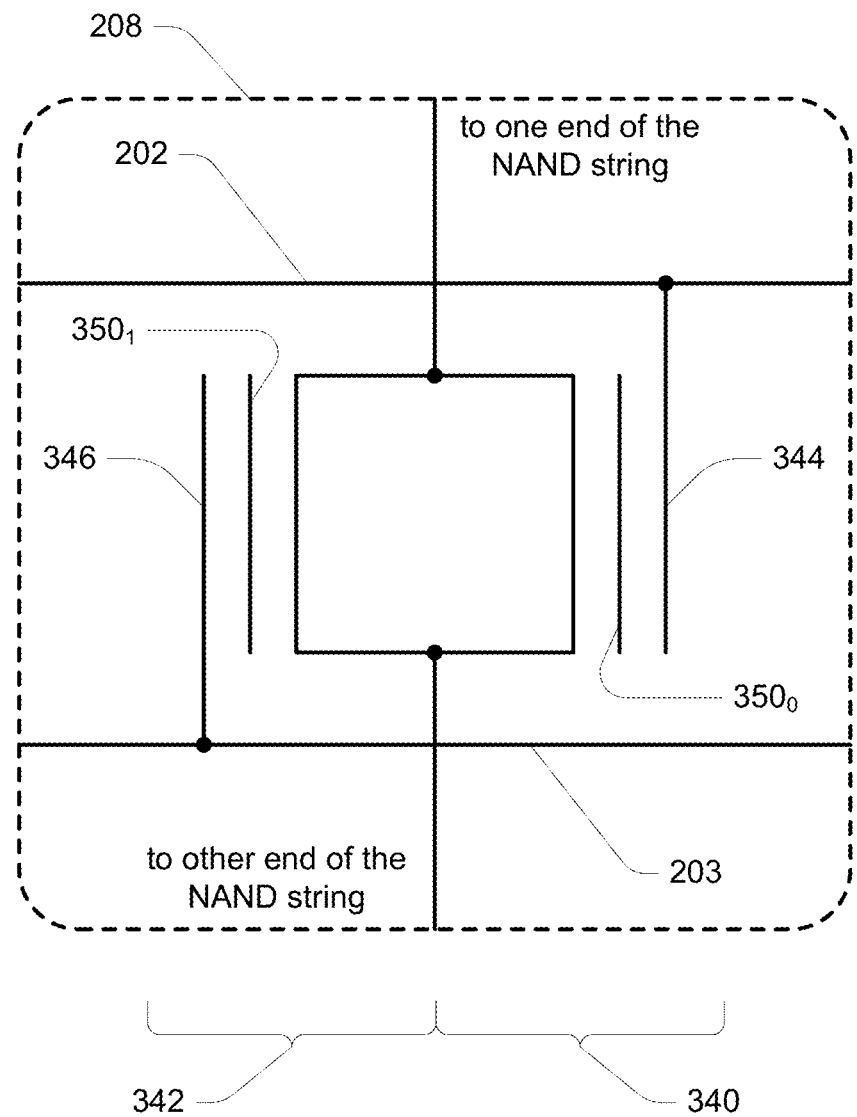
FIG. 3A is a schematic of a split-gate memory cell in accordance with an embodiment.

FIG. 3A is a schematic of a split-gate memory cell 208 in accordance with an embodiment. The memory cell 208 includes a primary memory cell portion 340 having its control gate 344 connected to (and is some cases, forming) a primary access line 202. The memory cell 208 further includes an assist memory cell portion 342 having its control gate 346 connected to (and is some cases, forming) an assist access line 203.

The primary memory cell portion 340 includes a data-storage structure $350_0$ (e.g., a floating gate, charge trap, or other structure configured to store charge) that can determine a data state of the primary memory cell portion 340 (e.g., through changes in threshold voltage). The data-storage structure $350_0$ might include both conductive and dielectric structures while the control gate 344 is generally formed of one or more conductive materials.

The assist memory cell portion 342 includes a data-storage structure $350_1$ (e.g., a floating gate, charge trap, or other structure configured to store charge) that can be used to adjust a threshold voltage of the assist memory cell portion 342. The data-storage structure $350_1$ might include both conductive and dielectric structures while the control gate 346 is generally formed of one or more conductive materials. For some embodiments, the data-storage structure $350_0$ and the data-storage structure $350_1$ might be isolated from one another. For other embodiments, the data-storage structure $350_0$ and the data-storage structure $350_1$ might be connected to one another, e.g., might be a single data-storage structure. For example, data-storage structures having bulk dielectric properties, e.g., data-storage structures fabricated solely with dielectric materials or fabricated with discontinuous instances of conductive materials (e.g., conductive nanodots or conductive crystals) contained within a continuous dielectric structure, might permit a single data-storage structure to store independent levels of charge between the control gate 344 and that data-storage structure, and between the control gate 346 and that data-storage structure.

Figure 3B:
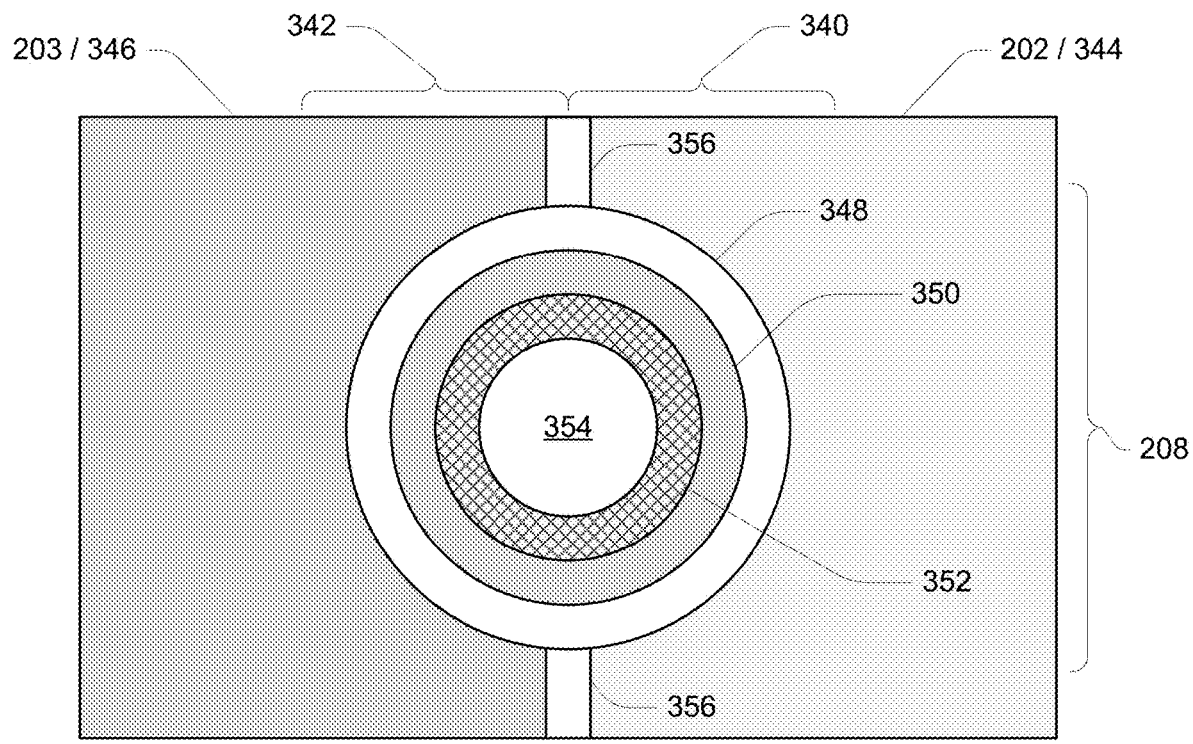
FIGS. 3B-3C plan views of split-gate memory cells in accordance with embodiments.
Figure 3C:
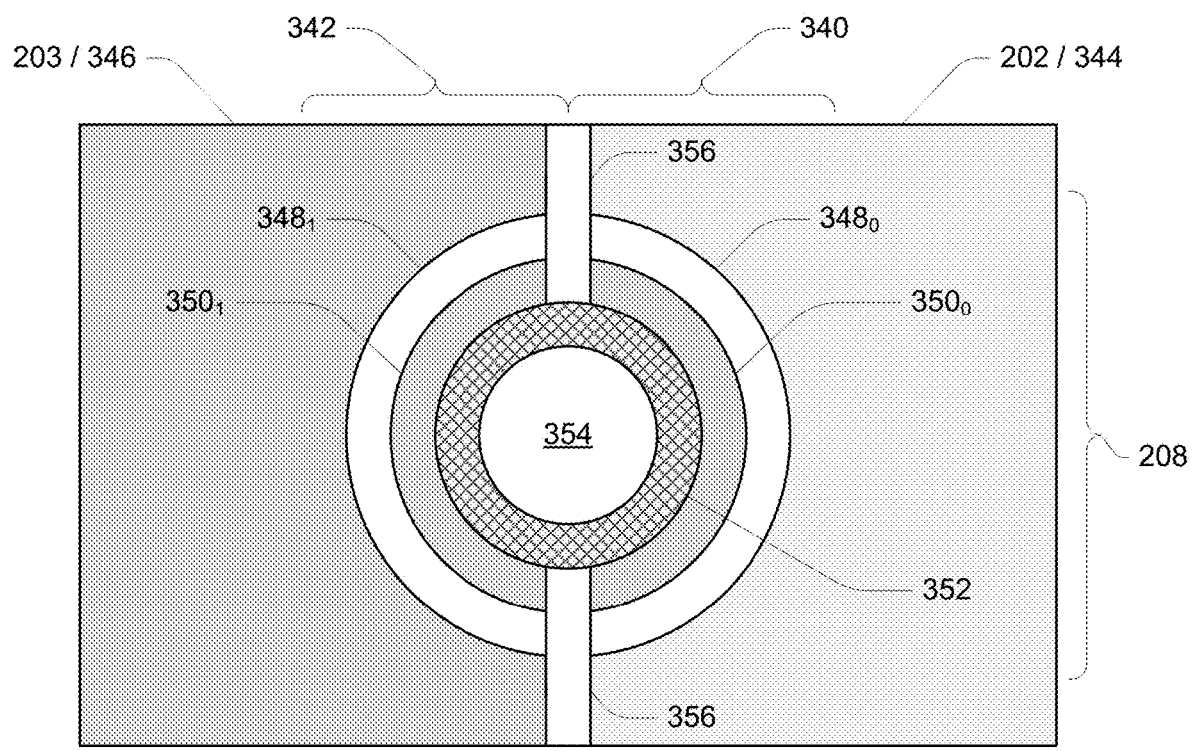

FIGS. 3B-3C plan views of split-gate memory cells 208 in accordance with embodiments. Like numbered elements in FIGS. 3B-3C correspond to the description as provided with respect to FIGS. 2A and 3A. FIGS. 3B-3C provide additional detail as to possible structures of the split-gate memory cells 208.

In the example of FIG. 3B, the memory cell 208 includes a primary memory cell portion 340 having its control gate 344 connected to (and is some cases, forming) a primary access line 202. The memory cell 208 further includes an assist memory cell portion 342 having its control gate 346 connected to (and is some cases, forming) an assist access line 203. The primary access line 202 and the assist access line 203 might be formed of one or more conductive materials. The primary access line 202 and the assist access line 203 might each comprise, consist of, or consist essentially of conductively doped polysilicon and/or might comprise, consist of, or consist essentially of metal, such as a refractory metal, or a metal-containing material, such as a refractory metal silicide or a metal nitride, e.g., a refractory metal nitride, as well as any other conductive material.

The primary memory cell portion 340 and the assist memory cell portion 342 might share a common charge-blocking structure 348. The charge-blocking structure 348 might contain a dielectric material. The charge-blocking structure 348 might comprise, consist of, or consist essentially of an oxide, e.g., silicon dioxide ($SiO_2$), and/or may comprise, consist of, or consist essentially of a high-K dielectric material, such as aluminum oxides ($AlO_x$), hafnium oxides ($HfO_x$), hafnium aluminum oxides ($HfAlO_x$), hafnium silicon oxides ($HfSiO_x$), lanthanum oxides ($LaO_x$), tantalum oxides ($TaO_x$), zirconium oxides ($ZrO_x$), zirconium aluminum oxides ($ZrAlO_x$), or yttrium oxide ($Y_2O_3$), as well as any other dielectric material. High-K dielectrics as used herein means a material having a dielectric constant greater than that of silicon dioxide.

The primary memory cell portion 340 and the assist memory cell portion 342 might further share a common data-storage structure 350 (e.g., a charge trap, or other dielectric structure configured to store charge) that can determine a data state of the primary memory cell portion 340 (e.g., through changes in threshold voltage) and that can be used to adjust a threshold voltage of the assist memory cell portion 342. The primary memory cell portion 340 and the assist memory cell portion 342 might further share a common gate-dielectric structure 352. The gate-dielectric structure 352 might contain a dielectric material such as described with reference to the charge-blocking structure 348.

The primary memory cell portion 340 and the assist memory cell portion 342 might further share a common semiconductor pillar 354. The semiconductor pillar 354 might be formed of a semiconductor material of a particular conductivity type. As one example, the semiconductor pillar 354 might be formed of a silicon-containing material, such as a P-type polysilicon. Although the semiconductor pillar 354 is depicted in FIG. 3B to have a solid core, the semiconductor pillar 354 could have an annular shape, e.g., a hollow core, similar to the shape of the gate-dielectric structure 352.

As depicted in FIG. 3B, the charge-blocking structure 348, data-storage structure 350, gate-dielectric structure 352 and semiconductor pillar 354 might extend a full length of a NAND string containing the memory cell 208. Alternatively, the charge-blocking structure 348, data-storage structure 350, and gate-dielectric structure 352 for the memory cell 208 of the NAND string might be isolated from the charge-blocking structure 348, data-storage structure 350, and/or gate-dielectric structure 352 for a different memory cell 208 of the NAND string, with only the semiconductor pillar 354 extending the full length of the NAND string.

Isolation regions 356 might extend between the primary access line 202 and the assist access line 203, e.g., to provide electrical isolation of the primary access line 202 from the assist access line 203. The isolation regions 356 might contain a dielectric material such as described with reference to the charge-blocking structure 348. The isolation regions 356 might extend to an outer surface of the charge-blocking structure 348 as depicted in FIG. 3B. The isolation regions 356 might further extend beyond the outer surface of the charge-blocking structure 348.

In the example of FIG. 3C, the memory cell 208 includes a primary memory cell portion 340 having its control gate 344 connected to (and is some cases, forming) a primary access line 202. The memory cell 208 further includes an assist memory cell portion 342 having its control gate 346 connected to (and is some cases, forming) an assist access line 203. The primary access line 202 and the assist access line 203 might be formed of one or more conductive materials. The primary access line 202 and the assist access line 203 might each comprise, consist of, or consist essentially of conductively doped polysilicon and/or might comprise, consist of, or consist essentially of metal, such as a refractory metal, or a metal-containing material, such as a refractory metal silicide or a metal nitride, e.g., a refractory metal nitride, as well as any other conductive material.

The primary memory cell portion 340 might include a charge-blocking structure $348_0$ and the assist memory cell portion 342 might include a charge-blocking structure $348_1$. The charge-blocking structures 348, e.g., $348_0$ and $348_1$, might each contain a dielectric material. The charge-blocking structures 348 might comprise, consist of, or consist essentially of an oxide, e.g., silicon dioxide ($SiO_2$), and/or may comprise, consist of, or consist essentially of a high-K dielectric material, such as aluminum oxides ($AlO_x$), hafnium oxides ($HfO_x$), hafnium aluminum oxides ($HfAlO_x$), hafnium silicon oxides ($HfSiO_x$), lanthanum oxides ($LaO_x$), tantalum oxides ($TaO_x$), zirconium oxides ($ZrO_x$), zirconium aluminum oxides ($ZrAlO_x$), or yttrium oxide ($Y_2O_3$), as well as any other dielectric material. High-K dielectrics as used herein means a material having a dielectric constant greater than that of silicon dioxide.

The primary memory cell portion 340 might further include a data-storage structure $350_0$ and the assist memory cell portion 342 might include a data-storage structure $350_1$. The data-storage structures 350, e.g., $350_0$ and $350_1$, might each include a floating gate, a charge trap, or other structure configured to store charge. The data-storage structure $350_0$ can determine a data state of the primary memory cell portion 340 (e.g., through changes in threshold voltage) and the data-storage structure $350_1$ can be used to adjust a threshold voltage of the assist memory cell portion 342. The primary memory cell portion 340 and the assist memory cell portion 342 might further share a common gate-dielectric structure 352. The gate-dielectric structure 352 might contain a dielectric material such as described with reference to the charge-blocking structure 348.

The primary memory cell portion 340 and the assist memory cell portion 342 might further share a common semiconductor pillar 354. The semiconductor pillar 354 might be formed of a semiconductor material of a particular conductivity type. As one example, the semiconductor pillar 354 might be formed of a silicon-containing material, such as a P-type polysilicon. Although the semiconductor pillar 354 is depicted in FIG. 3B to have a solid core, the semiconductor pillar 354 could have an annular shape, e.g., a hollow core, similar to the shape of the gate-dielectric structure 352.

As depicted in FIG. 3C, the charge-blocking structures $348_0$ and $348_1$, data-storage structures $350_0$ and $350_1$, gate-dielectric structure 352 and semiconductor pillar 354 might extend a full length of a NAND string containing the memory cell 208. Alternatively, the charge-blocking structures $348_0$ and $348_1$, data-storage structures $350_0$ and $350_1$, and gate-dielectric structure 352 for the memory cell 208 of the NAND string might be isolated from the charge-blocking structures $348_0$ and $348_1$, data-storage structures $350_0$ and $350_1$, and/or gate-dielectric structure 352 for a different memory cell 208 of the NAND string, with only the semiconductor pillar 354 extending the full length of the NAND string.

Isolation regions 356 might extend between the primary access line 202 and the assist access line 203, e.g., to provide electrical isolation of the primary access line 202 from the assist access line 203. The isolation regions 356 might contain a dielectric material such as described with reference to the charge-blocking structure 348. The isolation regions 356 might extend to an outer surface of the gate-dielectric structure 352 as depicted in FIG. 3C. The isolation regions 356 might further extend beyond the outer surface of the gate-dielectric structure 352, and might extend to be in contact with the semiconductor pillar 354, thus dividing the gate-dielectric structure 352 into two isolated structures.

FIG. 4 is a perspective view of an array structure in accordance with an embodiment. Like numbered elements in FIG. 4 correspond to the description as provided with respect to FIGS. 2A and 3A-3C. FIG. 4 provides additional detail as to an array structure for the split-gate memory cells 208.

FIG. 4 depicts a portion of an array of memory cells 400, that might have a structure corresponding to the schematic of the portion of an array of memory cells 200B of FIG. 2B. The primary access lines $202_X$ and $202_{X-1}$ and the assist access lines $203_X$ and $203_{X-1}$ might correspond to any two adjacent primary access lines $202_0$-$202_N$ and assist access lines $203_0$-$203_N$, respectively, of FIG. 2B, where X is an integer value from 1 to N. For example, the primary access line $202_X$ and assist access line $203_X$ of FIG. 4 might correspond to the primary access line $202_1$ and assist access line $203_1$ of FIG. 2B, respectively, while the primary access line $202_{X-1}$ and assist access line $203_{X-1}$ of FIG. 4 might correspond to the primary access line $202_0$ and assist access line $203_0$ of FIG. 2B, respectively.

Each grouping of memory cells 460, e.g., groupings of memory cells $460_0$-$460_3$, might correspond to columns of memory cells, each commonly selectively connected to a same data line. For example, the grouping of memory cells $460_0$ of FIG. 4 might depict portions of two NAND strings each selectively connected to the data line $204_0$ of FIG. 2B, the grouping of memory cells $460_1$ of FIG. 4 might depict portions of two NAND strings each selectively connected to the data line $204_1$ of FIG. 2B, and so on.

Each grouping of memory cells 462, e.g., groupings of memory cells $462_0$-$462_1$, might correspond to subarrays of memory cells, each selectively connected to a respective data line in response to a same select line. For example, the grouping of memory cells $462_0$ of FIG. 4 might depict portions of four NAND strings each selectively connected to a respective data line 204 of FIG. 2B in response to a control signal on the select line $215_0$, and the grouping of memory cells $462_1$ of FIG. 4 might depict portions of four NAND strings each selectively connected to a respective data line 204 of FIG. 2B in response to a control signal on the select line $215_1$.

Figure 4A:
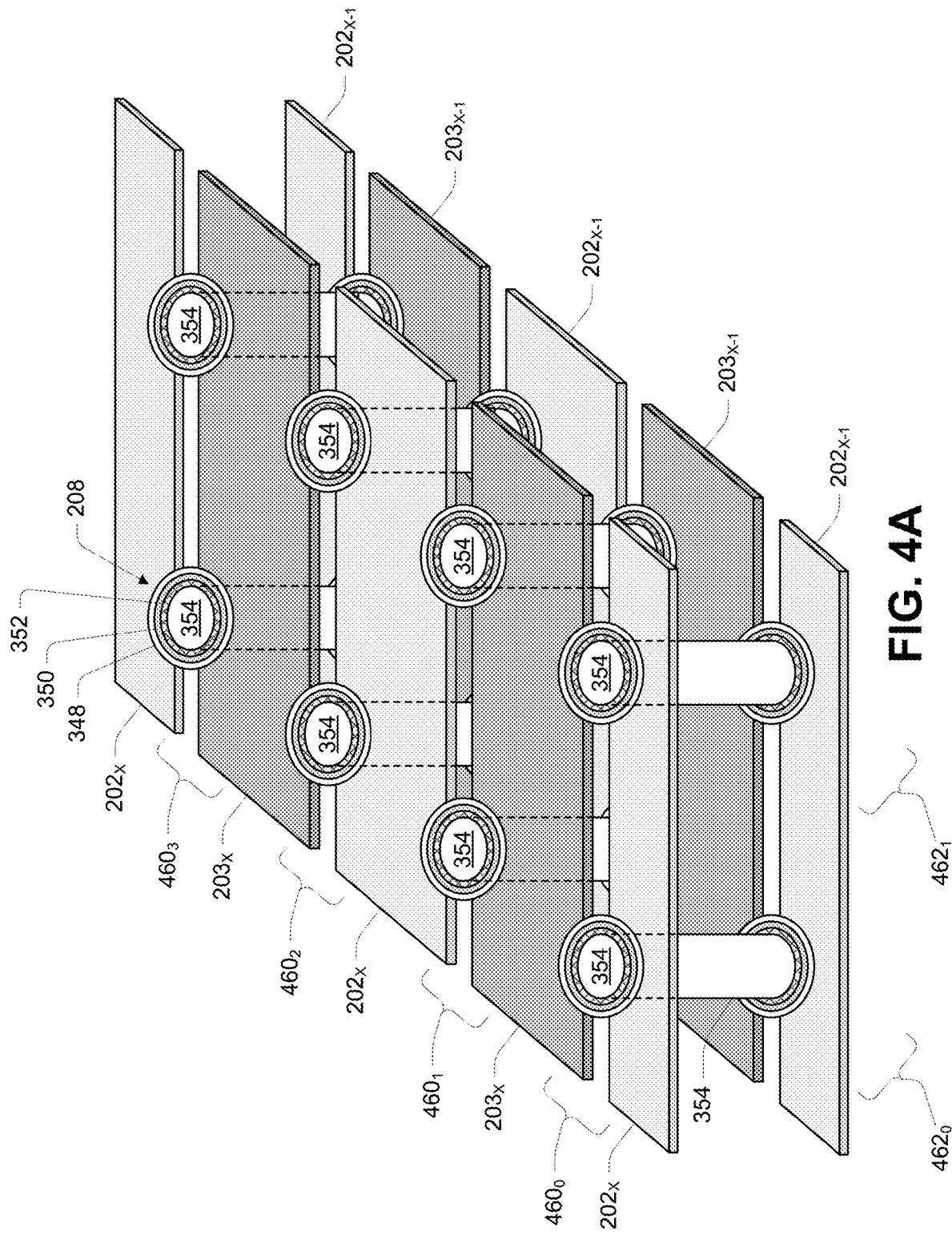
FIG. 4A is a perspective view of an array structure in accordance with an embodiment.
Figure 4B:
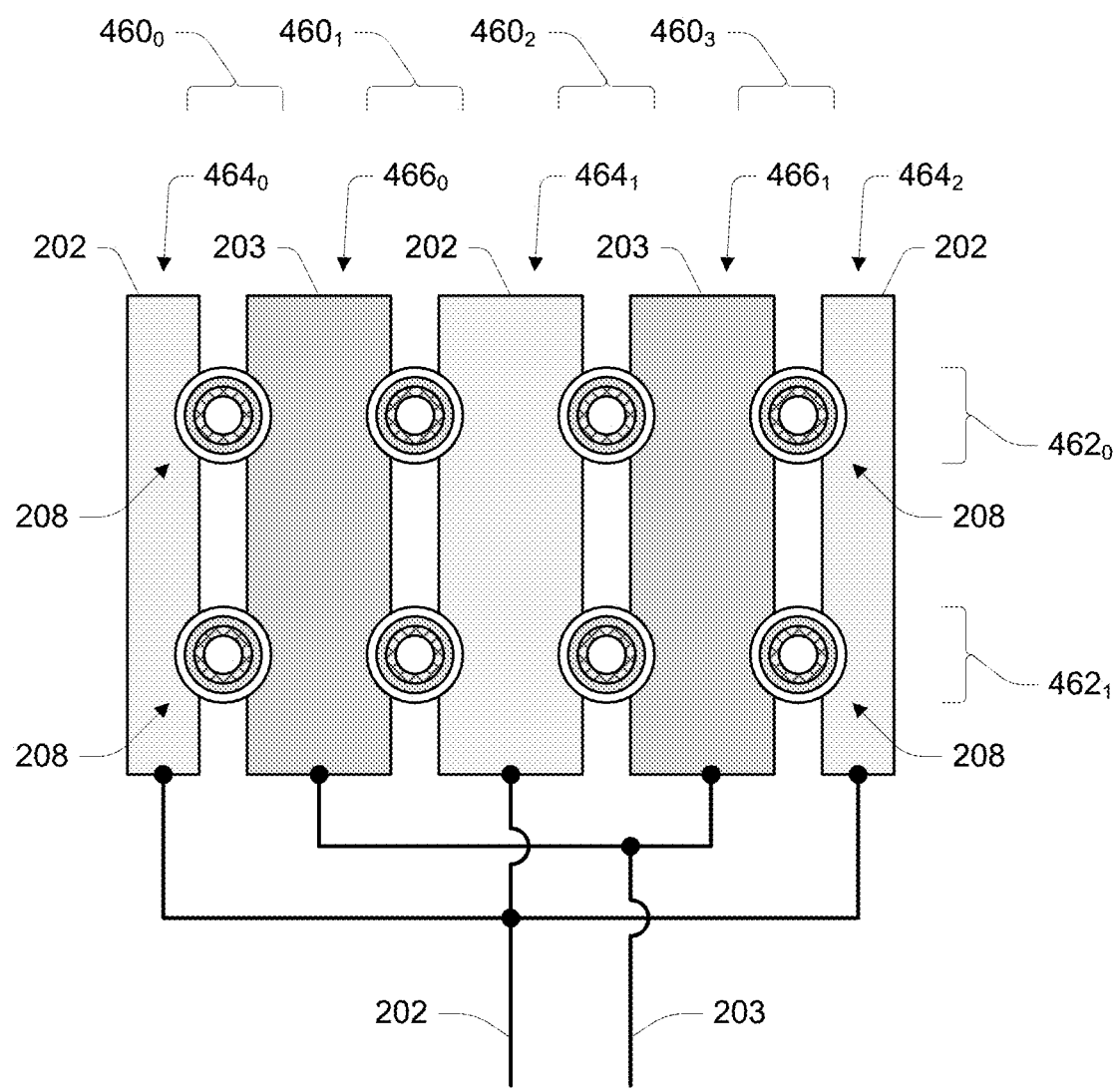
FIG. 4B is a plan view of an array structure of FIG. 4A in accordance with an embodiment.

FIG. 4B is a plan view of an array structure of FIG. 4A in accordance with an embodiment. FIG. 4B depicts an example of the electrical connection of portions 464, e.g., portions $464_0$-$464_2$, of the primary access line 202 and the electrical connection of portions 466, e.g., portions $466_0$-$466_1$, of an assist access line 203. For example, the portions 464 might each be commonly connected to collectively form the primary access line 202, and the portions 466 might each be commonly connected to collectively form the assist access line 203. The portions 464 and the portions 466 are interleaved, and one portion 464 or portion 466 might form a control gate for two groupings of memory cells 460, or columns of memory cells. For example, the portion $466_0$ of the assist access line 203 might form a control gate for the assist memory cell portions of the grouping of memory cells $460_0$ and of the grouping of memory cells $460_1$. Similarly, the portion 4641 of the primary access line 202 might form a control gate for the primary memory cell portions of the grouping of memory cells $460_1$ and of the grouping of memory cells $460_2$. While three portions 464 and two portions 466 are depicted, the primary access line 202 and assist access line 203 might be formed of higher numbers of portions 464 and 466, respectively. A number X of the portions 464 and a number Y of the portions 466 might satisfy one of the following relationships: X equals Y, X is one less than Y, or X is one greater than Y.

Figure 5:
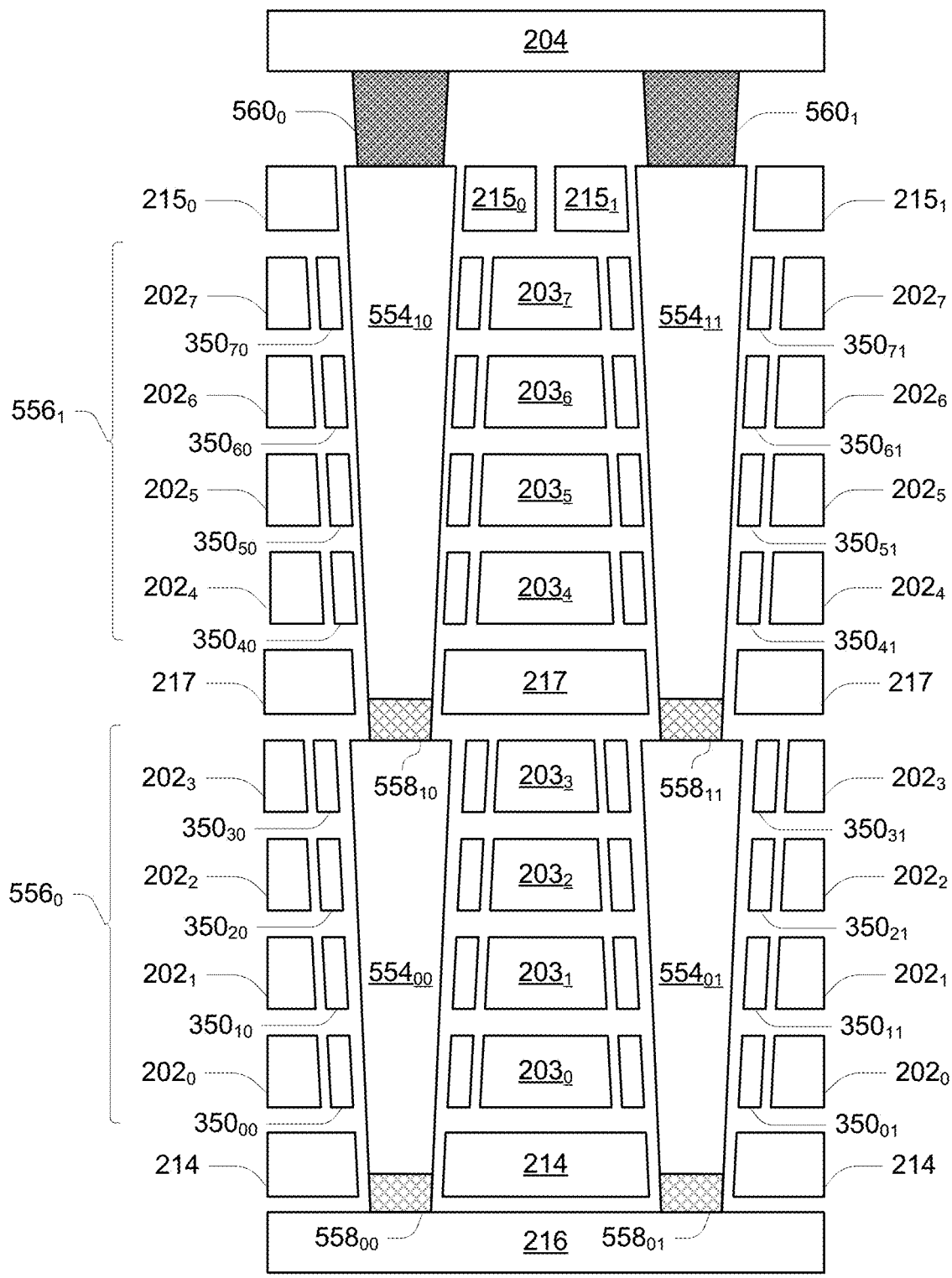
FIG. 5 is a cross-sectional view of a portion of an array of split-gate memory cells in accordance with an embodiment.

FIG. 5 is a cross-sectional view of a portion of an array of split-gate memory cells in accordance with an embodiment. Three-dimensional memory arrays are typically fabricated by forming alternating layers of conductors and dielectrics, forming holes in these layers, forming additional materials on sidewalls of the holes to define gate stacks for memory cells and other gates, e.g., select gates, and subsequently filling the holes with a semiconductor material to define a pillar section to act as channels of the memory cells and the gates. To improve conductivity of pillar sections and an adjacent semiconductor material, e.g., upon which they are formed, a conductive (e.g., conductively-doped) portion is typically formed in the pillar section at an interface with the adjacent semiconductor material. These conductive portions are typically formed of a different conductivity type than the pillar section and adjacent semiconductor material. For example, if the pillar section is formed of a P-type semiconductor material, the conductive portion might have an N-type conductivity.

Forming holes through multiple layers typically produces holes of decreasing diameter toward the bottom of the holes due to the nature of the removal processes commonly used in the semiconductor industry. To mitigate against the holes becoming too narrow, formation of arrays of the type described with reference to FIGS. 2A-2C and 4, might be segmented, such that the layers for forming a first portion of the NAND string might be formed, then portions might be removed to define holes, and the remaining structures might be formed within the holes. Following formation of the first portion of the NAND string, a second portion of the NAND string might be formed over the first portion in a similar manner. FIG. 5 depicts a structure of this type in accordance with an embodiment.

In FIG. 5, two strings of series-connected split-gate memory cells are depicted in the cross-sectional view. It is noted that the spaces between various elements of the figure generally represent dielectric material.

With reference to FIG. 5, a first NAND string might include a first pillar section $554_{00}$ and a second pillar section $554_{10}$. The first pillar section $554_{00}$ and the second pillar section $554_{00}$ might each be formed of a semiconductor material of a first conductivity type, such as a P-type polysilicon. Conductive portions $558_{00}$ and $558_{10}$ might be formed at the bottoms of the pillar sections $554_{00}$ and $554_{10}$, respectively, with the conductive portion $558_{00}$ electrically connected to the source 216 and the conductive portion $558_{10}$ electrically connected to the pillar section $554_{00}$. The conductive portions $558_{00}$ and $558_{10}$ might be formed of a semiconductor material of a second conductivity type different than the first conductivity type. For the example where the first pillar section $554_{00}$ and the second pillar section $554_{10}$ might each be formed of a P-type polysilicon, the conductive portions $558_{00}$ and $558_{10}$ might be formed of an N-type semiconductor material, such as an N-type polysilicon. In addition, the conductive portions $558_{00}$ and $558_{10}$ might have a higher conductivity level than the pillar sections $554_{00}$ and $554_{10}$. For example, the conductive portions $558_{00}$ and $558_{10}$ might have an N+ conductivity. Alternatively, the conductive portions $558_{00}$ and $558_{10}$ might be formed of a conductor, e.g., a metal or metal silicide.

The pillar section $554_{10}$ might be electrically connected to the data line 204 through a conductive plug $560_0$. The conductive plug $560_0$, in this example, might also be formed of a semiconductor material of the second conductivity type, and might likewise have a higher conductivity level than the pillar sections $554_{00}$ and $554_{10}$. Alternatively, the conductive plug $560_0$ might be formed of a conductor, e.g., a metal or metal silicide. The first NAND string might further include a source select gate at an intersection of the source select line 214 and the pillar section $554_{00}$, and a drain select gate at an intersection of the drain select line 215 and the pillar section $554_{10}$. The first NAND string might further include a split-gate memory cell at an intersection of each of the pillar sections $554_{00}$ and $554_{10}$, and the primary access lines $202_0$-$202_7$ and assist access lines $203_0$-$203_7$. These split-gate memory cells might further include data-storage structures $350_{00}$-$350_{70}$. While the structure of FIG. 5 is depicted to include only eight primary access lines 202 and eight assist access lines 203 for each NAND string in an effort to improve readability of the figure, NAND structures in accordance with embodiments might have significantly more primary access lines 202 and assist access lines 203.

Although not all numbered, for clarity of FIG. 5, data-storage structures 350 are depicted on both sides of the pillar sections 554. Individual data-storage structures 350 might wrap completely around their respective pillar section 554, such as depicted in the example of FIG. 3B. Alternatively, a first portion of a data-storage structure 350 between its respective pillar section 554 and its respective primary access line 202 might be isolated from a second portion of that data-storage structure 350 between its respective pillar section 554 and its respective assist access line 203, such as depicted in the example of FIG. 3C.

To improve the conductivity across the conductive portion $558_{10}$, the first NAND string might further include an intermediate gate at an intersection of the select line 217. This divides the split-gate memory cells of the first NAND string into a first deck of split-gate memory cells $556_0$ and a second deck of split-gate memory cells $556_1$. Although depicted as a traditional field-effect transistor, the intermediate gate formed at the intersection of a pillar section $554_{10}$ with the select line 217 might utilize a data-storage structure 350, along with a gate-dielectric structure and charge-blocking structure, similar to the memory cells formed at intersections of primary access lines 202 and assist access lines 203 with the pillar section $554_{10}$.

The decks of split-gate memory cells 556 can generally be thought of as groupings of split-gate memory cells sharing a common pillar section 554, i.e., a single pillar section 554 acting as channel regions for that grouping of split-gate memory cells, and can be extended to include a plurality of groupings of split-gate memory cells, where each such grouping of split-gate memory cells shares a common pillar section 554, and the respective common pillar sections 554 are formed at the same level (e.g., are intersected by the same primary access lines 202), which might include all such groupings of split-gate memory cells sharing a common set (e.g., one or more) of primary access lines 202. For example, deck of split-gate memory cells $556_0$ might include those split-gate memory cells formed at the intersections of primary access lines $202_0$-$202_3$, and assist access lines $203_0$-$203_3$, with the pillar section $554_{00}$. The deck of split-gate memory cells $556_0$ might further include those split-gate memory cells formed at the intersections of primary access lines $202_0$-$202_3$, and assist access lines $203_0$-$203_3$, with their respective pillar sections $554_{00}$ and $554_{01}$, and might still further include all split-gate memory cells formed at the intersections of primary access lines $202_0$-$202_3$, and assist access lines $203_0$-$203_3$, with the pillar sections $554_{00}$ and $554_{01}$, and with any other pillar sections 554 formed at the same level.

The channel regions for the primary memory cell portions of the split-gate memory cells of a grouping of split-gate memory cells are in communication with the channel regions for the assist memory cell portions of the split-gate memory cells of that grouping of memory cells. That is, a continuous conductive path can be established if at least one of the memory cell portions of each split-gate memory cell is activated. For example, a conductive path through the pillar section $554_{00}$ could be established by biasing the assist access lines $203_0$, $203_1$ and $203_3$ to activate the corresponding assist memory cell portions, and by biasing the primary access line $203_2$ to activate its corresponding primary memory cell portion.

With further reference to FIG. 5, a second NAND string might include the first pillar section $554_{01}$ and a second pillar section $554_{11}$. The first pillar section $554_{01}$ and a second pillar section $554_{11}$ might each be formed of a semiconductor material of the first conductivity type, such as a P-type polysilicon. Conductive portions $558_{01}$ and $558_{11}$ might be formed at the bottoms of the pillar sections $554_{01}$ and $554_{11}$, respectively, with the conductive portion $558_{01}$ electrically connected to the source 216 and the conductive portion $558_{11}$ electrically connected to the pillar section $554_{01}$. The conductive portions $558_{01}$ and $558_{11}$ might be formed of a semiconductor material of the second conductivity type. For the example where the first pillar section $554_{01}$ and a second pillar section $554_{11}$ might each be formed of a P-type polysilicon, the conductive portions $558_{01}$ and $558_{11}$ might be formed of an N-type semiconductor material, such as an N-type polysilicon. In addition, the conductive portions $558_{01}$ and $558_{11}$ might have a higher conductivity level than the pillar sections $554_{01}$ and $554_{11}$. For example, the conductive portions $558_{01}$ and $558_{11}$ might have an N+ conductivity.

The pillar section $554_{11}$ might be electrically connected to the data line 204 through a conductive plug $560_1$. The conductive plug $560_1$, in this example, might also be formed of a semiconductor material of the second conductivity type, and might likewise have a higher conductivity level than the pillar sections $554_{01}$ and $554_{11}$. Alternatively, the conductive plug $560_1$ might be formed of a conductor, e.g., a metal or metal silicide. The second NAND string might further include a source select gate at an intersection of the source select line 214 and the pillar section $554_{01}$, and a drain select gate at an intersection of the drain select line 215 and the pillar section $554_{11}$. The second NAND string might further include a split-gate memory cell at an intersection of each of the pillar sections $554_{01}$ and $554_{11}$, and the primary access lines $202_0$-$202_7$ and assist access lines $203_0$-$203_7$. These split-gate memory cells might further include data-storage structures $350_{01}$-$350_{71}$, which might have structures as described with reference to the data-storage structures $350_{00}$-$350_{70}$.

To improve the conductivity across the conductive portion $558_{11}$, the second NAND string might further include an intermediate gate at an intersection of the select line 217 and the pillar section $554_{11}$. This divides the split-gate memory cells of the second NAND string into the first deck of split-gate memory cells $556_0$ and the second deck of split-gate memory cells $556_1$. While only two decks of split-gate memory cells 556 are depicted in FIG. 5, fewer or more decks of split-gate memory cells 556 might be utilized in a NAND string in accordance with embodiments. In addition, although depicted as a traditional field-effect transistor, the intermediate gate formed at the intersection of a pillar section $554_{11}$ with the select line 217 might utilize a data-storage structure 350, along with a gate-dielectric structure and charge-blocking structure, similar to the memory cells formed at intersections of primary access lines 202 and assist access lines 203 with the pillar section $554_{11}$.

Figure 6:
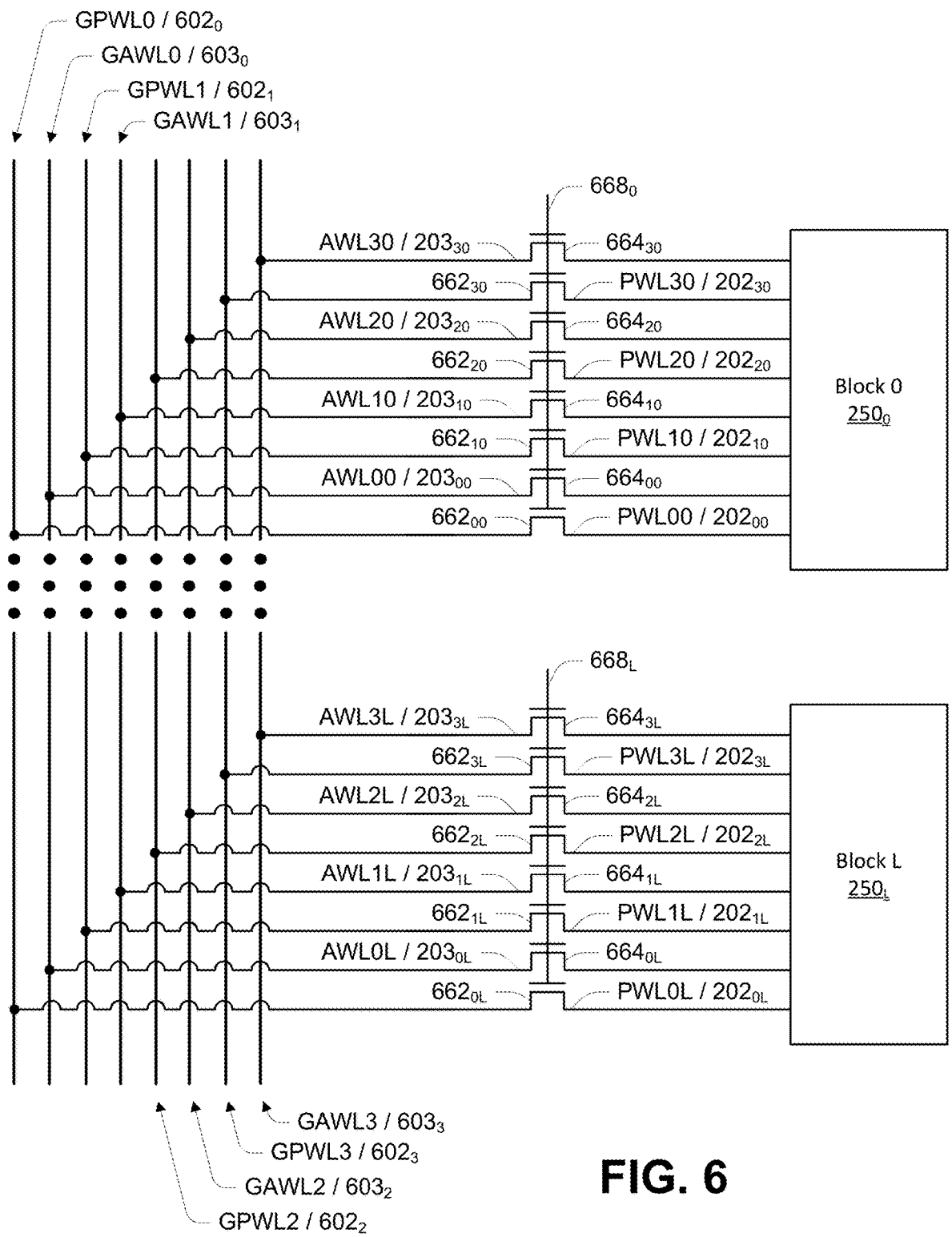
FIG. 6 is a schematic of a portion of an array of memory cells and string drivers as could be used in a memory device of the type described with reference to FIG. 1.

FIG. 6 is a schematic of a portion of an array of memory cells and string drivers as could be used in a memory device of the type described with reference to FIG. 1 and depicting a many-to-one relationship between local primary access lines (e.g., local primary word lines) 202 and global primary access lines (e.g., global primary word lines) 602, and a many-to-one relationship between local assist access lines (e.g., local assist word lines) 203 and global assist access lines (e.g., global assist word lines) 603.

As depicted in FIG. 6, a plurality of blocks of memory cells 250 might have their local primary access lines (e.g., local primary word lines) 202 commonly selectively connected to a plurality of global primary access lines (e.g., global primary word lines) 602, and might have their local assist access lines (e.g., local assist word lines) 203 commonly selectively connected to a plurality of global assist access lines (e.g., global assist word lines) 603. Although FIG. 6 depicts only blocks of memory cells $250_0$ and $250_L$ (Block 0 and Block L), additional blocks of memory cells 250 might have their local primary access lines 202 commonly connected to global primary access lines 602 in a like manner, and might have their local assist access lines 203 commonly connected to global assist access lines 603 in a like manner. Similarly, although FIG. 6 depicts only four local primary access lines 202 and four local assist access lines 203, blocks of memory cells 250 might include fewer or more local primary access lines 202 and local assist access lines 203. The blocks of memory cells $250_0$-$250_L$ might belong to a single plane of memory cells 242.

To facilitate memory access operations to specific blocks of memory cells 250 commonly coupled to a given set of global primary access lines 602 and a given set of global assist access lines 603, each block of memory cells 250 might have a corresponding set of block select transistors 662 in a one-to-one relationship with their local primary access lines 202 and a corresponding set of block select transistors 664 in a one-to-one relationship with their local assist access lines 203. Control gates of the set of block select transistors 662 and the set of block select transistor 664 for a given block of memory cells 250 might have their control gates commonly connected to a corresponding block select line 668. For example, for block of memory cells $250_0$, local primary access line $202_{00}$ might be selectively connected to global primary access line $602_0$ through block select transistor $662_{00}$, local assist access line $203_{00}$ might be selectively connected to global assist access line $603_0$ through block select transistor $664_{00}$, local primary access line $202_{10}$ might be selectively connected to global primary access line $602_1$ through block select transistor $662_{10}$, local assist access line $203_{10}$ might be selectively connected to global assist access line $603_1$ through block select transistor $664_{10}$, local primary access line $202_{20}$ might be selectively connected to global primary access line $602_2$ through block select transistor $662_{20}$, local assist access line $203_{20}$ might be selectively connected to global assist access line $603_2$ through block select transistor $664_{20}$, local primary access line $202_{30}$ might be selectively connected to global primary access line $602_3$ through block select transistor $662_{30}$, and local assist access line $203_{30}$ might be selectively connected to global assist access line $603_3$ through block select transistor $664_{30}$, while block select transistors $662_{00}$-$662_{30}$ and block select transistors $664_{00}$-$664_{30}$ are responsive to a control signal received on block select line $668_0$. The block select transistors 662 and block select transistors 664 for a block of memory cells 250 might collectively be referred to as a string driver, or simply driver circuitry.

Figure 7A:
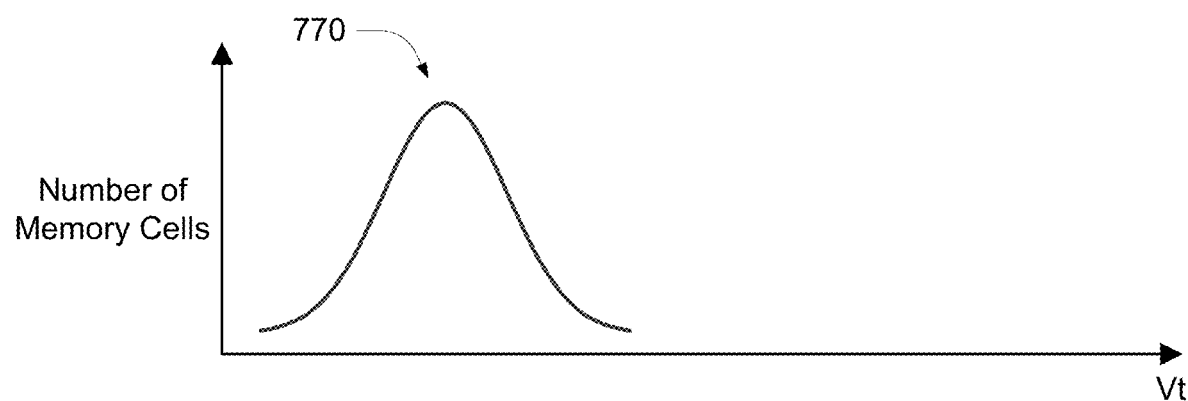
FIGS. 7A-7B are conceptual depictions of threshold voltage distributions of a plurality of memory cells for use with embodiments.
Figure 7B:
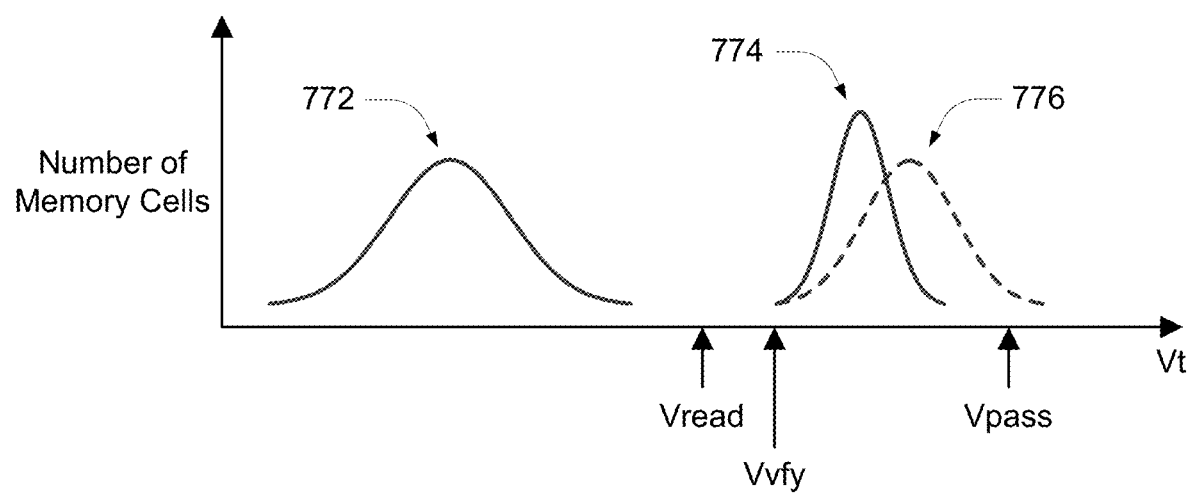

FIGS. 7A-7B are conceptual depictions of threshold voltage distributions of a plurality of memory cells for use with embodiments. FIG. 7A illustrates an example of a threshold voltage range and its threshold voltage distribution 770 for a plurality of memory cells following an erase operation on those memory cells. For example, charge might be removed from the data-storage structures of those memory cells to place them in an initial data state, e.g., an erased data state. FIG. 7B illustrates an example of threshold voltage ranges and their distributions for what might be referred to as single-level memory cells, often referred to as SLC. A memory cell programmed as SLC might store one of two data states, e.g., a logical 1 or a logical 0 data state. For example, the threshold voltage distribution 772 might represent a logical 1 data state, and the threshold voltage distribution 774 might represent a logical 0 data state.

In programming SLC memory, memory cells intended to have a threshold voltage within the threshold voltage distribution 772 might be inhibited from programming, such that they might maintain the threshold voltage that they had in the threshold voltage distribution 770 of FIG. 7A. Memory cells intended to have a threshold voltage within the threshold voltage distribution 774 might be enabled for programming in order to shift (e.g., increase) their threshold voltage. Typically, such programming would involve the application of a programming pulse to the control gate of a memory cell, followed by a verify operation to determine whether that memory cell has reached a desired threshold voltage. Typical programming operations use many programming pulses in an incremental step pulse programming scheme, where each programming pulse is a single pulse that moves the memory cell threshold voltage by some amount, and each subsequent programming pulse is higher than a preceding programming pulse. For the verify operation, a verify voltage Vvfy might be applied to the control gate of that memory cell to determine whether the memory cell remains deactivated. If the memory cell remains deactivated in response to the verify voltage Vvfy, programming might be deemed to be complete for that memory cell. If the memory cell is activated in response to the verify voltage Vvfy, an additional, higher, programming pulse might be applied to the control gate of that memory cell while it is enabled for programming. This process of program/verify might be repeated until each memory cell selected for programming has reached its desired data state.

To sense the data state of a memory cell (e.g., selected memory cell) of a string of series-connected memory cells, that memory cell might receive the verify voltage Vvfy at its control gate for a verify operation or a read voltage Vread at its control gate for a read operation. The verify voltage Vvfy is typically higher than the read voltage Vread to improve reliability of the subsequent read operation. During either a verify operation or a read operation, remaining memory cells (e.g., unselected memory cells) of that string of series-connected memory cells might receive a pass voltage Vpass applied to their control gates that is expected to activate those memory cell regardless of their data state. In this manner, the ability of the string of series-connected memory cells to pass current can be used to indicate whether the selected memory cell is activated or deactivated.

During a programming operation, some memory cells might become over programmed, which might be indicated by the threshold voltage distribution 776. This might occur if the voltage level difference between one programming pulse and an immediately subsequent programming pulse is too high for the programming speed of the memory cells. A programming speed of a memory cell might be unexpectedly fast due to anomalies in the fabrication process or materials, for example. While smaller incremental steps between programming pulses can reduce the risk of over programming, this also generally increases the time and power requirements to complete the programming operation.

Memory cells of the threshold voltage distribution 776 having threshold voltages higher than the pass voltage Vpass would remain deactivated in response to the pass voltage Vpass applied to their control gates. As such, during a sense operation (e.g., verify operation or read operation), a string of series-connected memory cells containing unselected memory cells having threshold voltages higher than the pass voltage Vpass would indicate the selected memory cell as being deactivated regardless of whether it was activated in response to the read voltage Vread applied to its control gate. This can lead to data errors. Various embodiments provide an array structure and mechanism to mitigate such errors. Various embodiments might further facilitate decreases in programming time and decreases in power requirements to complete a programming operation.

For example, the assist memory cell portions of a string of series-connected split-gate memory cells might each be programmed to a controlled range of threshold voltages. This programming might be performed prior to installing the memory into an electronic system. It would be expected that such programming of the assist memory cell portions might be performed only rarely, and perhaps only once during an expected life of the memory. With the assist memory cell portions having a controlled range of threshold voltages, over programming of the primary memory cell portions may become moot. In particular, because activation of only one memory cell portion of a split-gate memory cell can provide a current path through the split-gate memory cell, a primary memory cell portion of an unselected split-gate memory cell deactivated in response to a pass voltage during a read operation of a selected split-gate memory cell would not affect the sensed data state of the selected split-gate memory cell provided the assist memory cell portion of the unselected split-gate memory cell is activated. As such, programming of a primary memory cell portion might be performed with a single programming pulse having a voltage level sufficient to increase its threshold voltage beyond the verify voltage. Such a voltage level might be determined during characterization of the memory during fabrication and testing. This voltage level might represent the minimum voltage level determined to sufficiently increases the threshold voltage of each memory cell of the memory. Alternatively, respective voltage levels might be determined for smaller groupings of memory cells, such as blocks of memory cells, or pages of memory cells.

To prepare a memory in accordance with an embodiment, both the primary memory cell portion and the assist memory cell portion of the split-gate memory cells might be erased. Table 1 provides an example of voltage levels that might be applied to a string of series-connected split-gate memory cells during an erase operation of both the primary memory cell portions and the assist memory cell portions.

TABLE 1

| Node | Voltage Level |
| --- | --- |
| Data Line 204 | 20 V |
| Primary Access Lines 202 | 0 V |
| Assist Access Lines 203 | 0 V |
| Source 216 | 20 V |

Other voltage levels could be used to erase the split-gate memory cells. In general, a voltage differential is applied between the control gates of the split-gate memory cell and the channel regions of the split-gate memory cells configured to remove charge from the data-storage nodes of the primary memory cell portions and the assist memory cell portions. Although not listed in Table 1, select gates, e.g., select gates 210 and 212, might be activated during the erase operation. It is noted that the erase operation might be iterative, with increasing erase voltages applied to the data line and source. An erase verify operation might be performed between erase voltages.

Following erasure of the split-gate memory cells, the assist memory cell portions might be programmed to a controlled range of threshold voltages. Programming the assist memory cell portions might include an iterative process of applying a programming pulse to an assist memory cell portion and verifying if that assist memory cell portion has reached its target threshold voltage in response to that programming pulse, and repeating that iterative process until that assist memory cell portion passes the verification. Once an assist memory cell portion passes the verification, it may be inhibited from further programming, although other assist memory cell portions may still be enabled for programming for subsequent programming pulses. The iterative process can be repeated with changing (e.g., increasing) voltage levels of the programming pulse until each assist memory cell portion selected for the programming operation has reached the target threshold voltage, or until some failure is declared, e.g., reaching a maximum number of allowed programming pulses during the programming operation. Table 2 provides an example of voltage levels that might be applied to a string of series-connected split-gate memory cells during a programming operation of an assist memory cell portion of a selected split-gate memory cell.

TABLE 2

| | Voltage Level | |
| --- | --- | --- |
| Node | Enabled | Inhibited |
| Data Line 204 | 0 V | Vcc |
| Primary Access Lines 202 | | 10 V |
| Selected Assist Access Line 203 | | 15-20 V |
| Unselected Assist Access Lines 203 | | 10 V |

Other voltage levels could be used to program an assist memory cell portion of a split-gate memory cell. Although not listed in Table 2, source select gates, e.g., select gates 210, might be deactivated during the programming operation, while drain select gates, e.g., select gates 212, might be activated for enabled split-gate memory cells and deactivated for inhibited split-gate memory cells. In general, a voltage differential is applied between the control gate of the assist memory cell portion of the selected split-gate memory cell and the channel region of the selected split-gate memory cell configured to add charge to the data storage node of the assist memory cell portion of the selected split-gate memory cell. The primary memory cell portions and the unselected assist memory cell portions might receive a voltage level at their control gates configured to activate those memory cell portions and to inhibit programming of those memory cell portions. The programming operation might be performed concurrently for the assist memory cell portion of each split-gate memory cell connected to the selected assist access line and selectively connected to a respective data line in response to a control signal on a same select line 215. In response to an assist memory cell portion reaching the target threshold voltage, the respective data line selectively connected to that assist memory cell portion might be increased to a voltage level, e.g., an inhibit voltage, configured to deactivate its corresponding drain select gate 212, such that channel regions of inhibited strings of series-connected memory cells would become electrically floating. The resulting threshold voltage distribution of the assist memory cell portions might correspond to the threshold voltage distribution 774 of FIG. 7B. Selection of a voltage difference between adjacent programming pulses can be used to control a width of the threshold voltage distribution in manners understood in the art. In this manner, the controlled range of threshold voltages of the assist memory cell portions might be higher than the verify voltage level, and lower than the pass voltage of a read operation of the memory.

As noted previously, a verify operation might be performed between programming pulses. Table 3 provides an example of voltage levels that might be applied to a string of series-connected split-gate memory cells during a verify operation of an assist memory cell portion of a selected split-gate memory cell.

TABLE 3

| Node | Voltage Level |
| --- | --- |
| Data Line 204 | Vcc |
| Primary Access Lines 202 | −3 V |
| Selected Assist Access Line 203 | 0.5 V |
| Unselected Assist Access Lines 203 | 5 V |
| Source 216 | 0 V |

Other voltage levels could be used to verify an assist memory cell portion of a split-gate memory cell. In general, the verify voltage level, e.g., 0.5V in this example, might be applied to the control gate of the assist memory cell portion of the selected split-gate memory cell. For the remaining unselected split-gate memory cells, the control gates of their assist memory cell portions might receive a voltage level, e.g., a pass voltage, sufficient to activate those assist memory cell portions if they had threshold voltages within the controlled range of threshold voltages. Note that some of the assist memory cell portions of the unselected split-gate memory cells might still be in an erased state if their programming has not been performed. However, such assist memory cell portions would still be activated in response to the pass voltage. During the verify operation, the control gates of the primary memory cell portions of each split-gate memory cell of the string of series-connected split-gate memory cells might receive a voltage level sufficient to deactivate those primary memory cell portions having a threshold voltage corresponding to the erased state. If current flow is detected through the assist memory cell portion of the selected split-gate memory cell, such as through a voltage drop on the data line, the assist memory cell portion might be deemed to fail the verify operation and be enabled for programming during a subsequent programming pulse. If current flow is not detected through the assist memory cell portion of the selected split-gate memory cell, the assist memory cell portion might be deemed to pass the verify operation and be inhibited from programming during a subsequent programming pulse.

The programming of the assist memory cell portions might be performed by a fabricator of the memory. A desire to reprogram the assist memory cell portions might be evaluated autonomously by the memory, e.g., in response to a number of program/erase cycles of the primary memory cell portions of the split-gate memory cells, or in response to an event, such as a number of bit errors exceeding a threshold. For example, a background verify operation could be performed to determine if any of the assist memory cell portions have experienced charge loss, such that their threshold voltages are lower than the verify voltage level. Such assist memory cell portions could then be reprogrammed as discussed with reference to Table 2. This operation might be performed when the memory is idle, such that it could be invisible to a user of the memory. Note that no erase operation is necessary prior to reprogramming as the goal is simply to increase the threshold voltage from its current level back into the controlled range of threshold voltages.

With the assist memory cell portions programmed to have threshold voltage levels within their desired controlled range of threshold voltages, user data can be programmed into the primary memory cell portions of the split-gate memory cells. While programming of the primary memory cell portions can involve an iterative process like the assist memory cell portions, various embodiments have been disclosed to mitigate errors resulting from over-programming. As such, programming of the primary memory cell portions as SLC memory might include applying a single programming pulse to a primary memory cell portion having a voltage level deemed sufficient to increase its threshold voltage above a read voltage of a read operation of the memory. Such a voltage level can be determined during characterization of the memory. A verify operation might not be performed. Although such advantages might be unavailable if there is a desire to store data to the primary memory cell portions at higher memory densities, e.g., MLC, TLC, QLC, etc., various embodiments might still mitigate errors resulting from over-programmed primary memory cell portions. Table 4 provides an example of voltage levels that might be applied to a string of series-connected split-gate memory cells during a programming operation of a primary memory cell portion of a selected split-gate memory cell.

TABLE 4

| Node | Voltage Level | |
|---|---|---|
| | Enabled | Inhibited |
| Data Line 204 | 0 V | Vcc |
| Selected Primary Access Line 202 | | 20 V |
| Unselected Primary Access Lines 202 | | 10 V |
| Assist Access Lines 203 | | 10 V |

Other voltage levels could be used to program a primary memory cell portion of a split-gate memory cell. Although not listed in Table 4, source select gates, e.g., select gates 210, might be deactivated during the programming operation, while drain select gates, e.g., select gates 212 might be activated for enabled split-gate memory cells and deactivated for inhibited split-gate memory cells. In general, a voltage differential is applied between the control gate of the primary memory cell portion of the selected split-gate memory cell and the channel region of the selected split-gate memory cell configured to add charge to the data storage node of the primary memory cell portion of the selected split-gate memory cell. The assist memory cell portions and the unselected primary memory cell portions might receive a voltage level at their control gates configured to activate those memory cell portions and to inhibit programming of those memory cell portions. The programming operation might be performed concurrently for the primary memory cell portion of each split-gate memory cell connected to the selected primary access line and selectively connected to a respective data line in response to a control signal on a same select line 215. The resulting threshold voltage distribution of the primary memory cell portions might correspond to the threshold voltage distribution 776 of FIG. 7B.

Following programming of a primary memory cell portion, a read operation might be performed. Table 5 provides an example of voltage levels that might be applied to a string of series-connected split-gate memory cells during a read operation of a primary memory cell portion of a selected split-gate memory cell.

TABLE 5

| Node | Voltage Level |
|---|---|
| Data Line 204 | Vcc |
| Selected Primary Access Line 202 | 0 V |
| Unselected Primary Access Lines 202 | 5 V |
| Selected Assist Access Line 203 | 0 V |
| Unselected Assist Access Lines 203 | 5 V |
| Source 216 | 0 V |

Other voltage levels could be used to verify an assist memory cell portion of a split-gate memory cell. Although not listed in Table 5, select gates, e.g., select gates 210 and 212, might be activated during the read operation. In general, a read voltage level, e.g., 0V in this example, might be applied to the control gate of the primary memory cell portion of the selected split-gate memory cell to selectively activate that primary memory cell portion depending upon its data state. The control gate of the assist memory cell portion of the selected split-gate memory cell might receive a voltage level configured to deactivate that assist memory cell portion. For the remaining unselected split-gate memory cells, the control gates of their assist memory cell portions might receive a voltage level, e.g., a pass voltage, sufficient to activate those assist memory cell portions if they had threshold voltages within the controlled range of threshold voltages. Although not necessary, the control gates of the primary memory cell portions of the unselected split-gate memory cells might also receive the pass voltage expected to activate those primary memory cell portions regardless of their data states. For some embodiments, the unselected primary access lines 202 might receive 0V, which might reduce energy requirements during the read operation.

The data state of the selected split-gate memory cell might be determined by sensing current flow through the primary memory cell portion of the selected split-gate memory cell. If current flow is detected through the primary memory cell portion of the selected split-gate memory cell, such as through a voltage drop on the data line, the selected split-gate memory cell might be deemed to have a first data state, e.g., an erased data state or a logic 1. If current flow is not detected through the primary memory cell portion of the selected split-gate memory cell, the selected split-gate memory cell might be deemed to have a second data state, e.g., a programmed data state or a logic 0.

Erasing primary memory cell portions might be performed without erasing the assist memory cell portions. Table 6 provides an example of voltage levels that might be applied to a string of series-connected split-gate memory cells during an erase operation of the primary memory cell portions.

TABLE 6

| Node | Voltage Level |
|---|---|
| Data Line 204 | 20 V |
| Primary Access Lines 202 | 0 V |
| Assist Access Lines 203 | floating |
| Source 216 | 20 V |

Other voltage levels could be used to erase the primary memory cell portions of the split-gate memory cells. In general, a voltage differential is applied between the control gates of the primary memory cell portions of the split-gate memory cell and the channel regions of the split-gate memory cells configured to remove charge from the data-storage nodes of the primary memory cell portions. Electrically floating the assist access lines allows them to follow the voltage level of the channel regions through capacitive coupling, thus inhibiting erasure of the assist memory cell portions. Although not listed in Table 6, select gates, e.g., select gates 210 and 212, might be activated during the erase operation. It is noted that the erase operation might be iterative, with increasing erase voltages applied to the data line and source. An erase verify operation might be performed between erase voltages.

Figure 8:
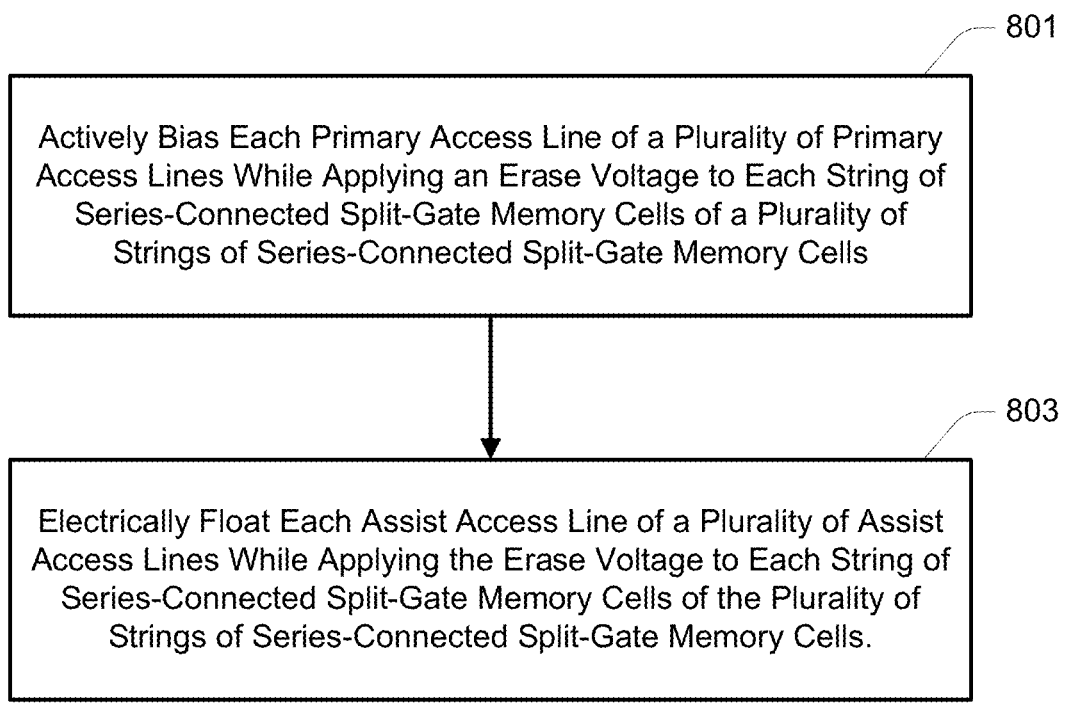
FIG. 8 depicts a flowchart of a method of operating a memory according to an embodiment.

FIG. 8 depicts a flowchart of a method of operating a memory according to an embodiment, e.g., during an erase operation in accordance with an embodiment. The method might be in the form of computer-readable instructions, e.g., stored to the instruction registers 128. Such computer-readable instructions might be executed by a controller, e.g., the control logic 116, to cause the memory (e.g., relevant components of the memory) to perform the method.

At 801, each primary access line of a plurality of primary access lines might be actively biased while applying an erase voltage to each string of series-connected split-gate memory cells of a plurality of strings of series-connected split-gate memory cells. The bias level for a particular primary access line of the plurality of primary access lines might be a voltage level configured to remove charge from a data-storage structure of each primary memory cell portion connected to the particular primary access line. Different voltage levels could be applied to different primary access lines of the plurality of primary access lines. For example, in an array structure similar to that of FIG. 5, but having more than two decks, different channel voltages might result in different pillar sections, such that primary access lines for different decks might receive different voltage levels to provide similar (e.g., same) voltage differentials.

At 803, each assist access line of a plurality of assist access lines might be electrically floated while applying the erase voltage to each string of series-connected split-gate memory cells of the plurality of strings of series-connected split-gate memory cells. Assist memory cell portions of the plurality of strings of series-connected split-gate memory cells might each have a positive threshold voltage. Primary memory cell portions of the plurality of strings of series-connected split-gate memory cells might positive or negative threshold voltages.

Figure 9:
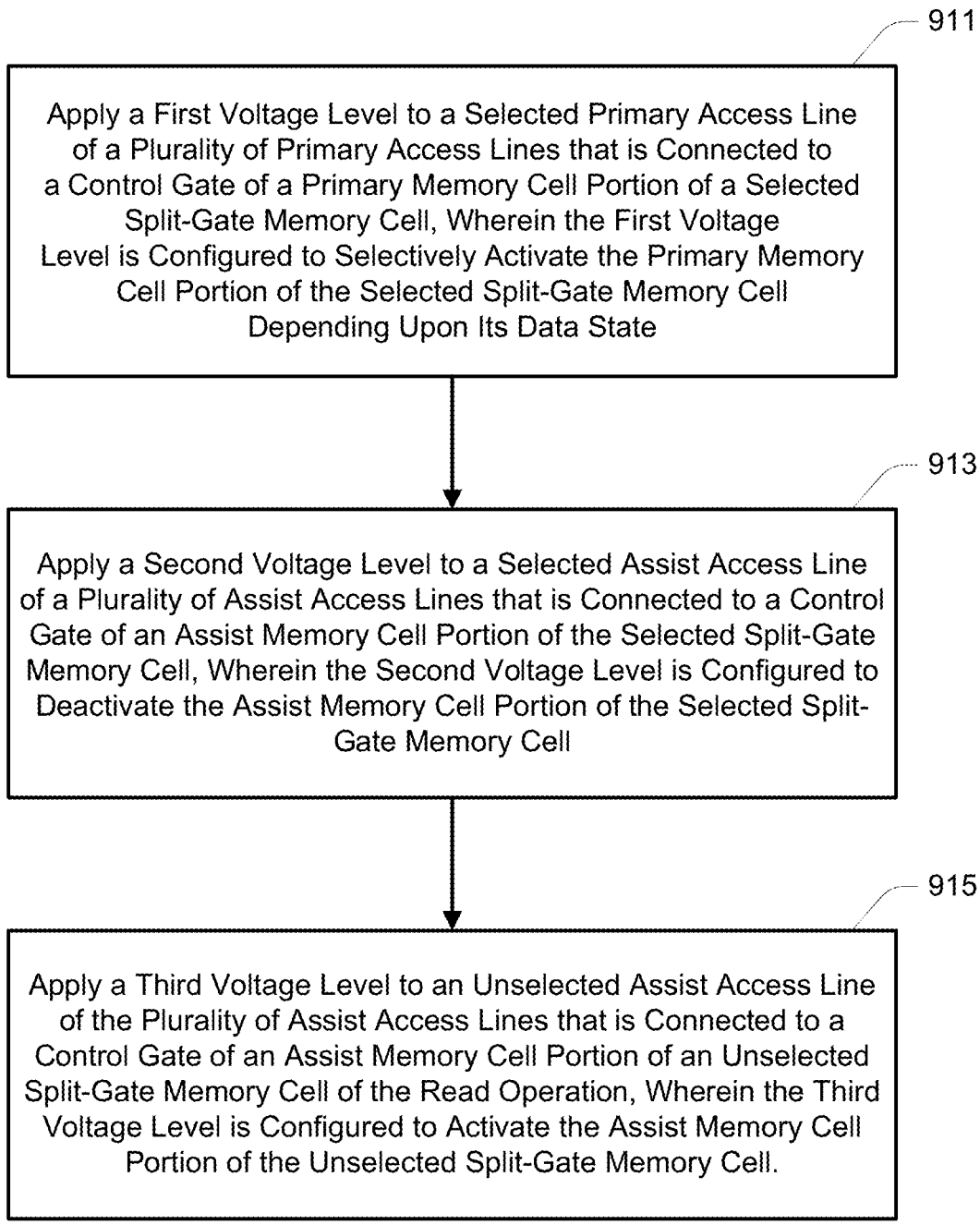
FIG. 9 depicts a flowchart of a method of operating a memory according to another embodiment.

FIG. 9 depicts a flowchart of a method of operating a memory according to an embodiment, e.g., during a read operation in accordance with an embodiment. The method might be in the form of computer-readable instructions, e.g., stored to the instruction registers 128. Such computer-readable instructions might be executed by a controller, e.g., the control logic 116, to cause the memory (e.g., relevant components of the memory) to perform the method.

At 911, a first voltage level might be applied to a selected primary access line of a plurality of primary access lines that is connected to a control gate of a primary memory cell portion of a selected split-gate memory cell, wherein the first voltage level is configured to selectively activate the primary memory cell portion of the selected split-gate memory cell depending upon its data state.

At 913, a second voltage level might be applied to a selected assist access line of a plurality of assist access lines that is connected to a control gate of an assist memory cell portion of the selected split-gate memory cell, wherein the second voltage level is configured to deactivate the assist memory cell portion of the selected split-gate memory cell.

At 915, a third voltage level might be applied to an unselected assist access line of the plurality of assist access lines that is connected to a control gate of an assist memory cell portion of an unselected split-gate memory cell of the read operation, wherein the third voltage level is configured to activate the assist memory cell portion of the unselected split-gate memory cell. The third voltage level might be applied to each assist access line of the plurality of assist access lines other than the selected assist access line. The third voltage level might further be applied to an unselected primary access line of the plurality of primary access lines that is connected to the control gate of the primary memory cell portion of the unselected split-gate memory cell, wherein the third voltage level is configured to activate the primary memory cell portion of the unselected split-gate memory cell. The third voltage level might further be applied to each primary access line of the plurality of primary access lines other than the selected primary access line.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:
1. A memory, comprising:
an array of memory cells comprising a plurality of strings of series-connected split-gate memory cells, wherein each split-gate memory cell of the plurality of strings of series-connected split-gate memory cells comprises a primary memory cell portion and an assist memory cell portion, and wherein, for each split-gate memory cell of the plurality of strings of series-connected split-gate memory cells, the primary memory cell portion of that split-gate memory cell is configured to store a data state that is accessible through a read operation during normal operation of the memory and a data state of the assist memory cell portion of that split-gate memory cell is configured to be inaccessible through the read operation during normal operation of the memory;

a plurality of primary access lines, wherein each primary access line of the plurality of primary access lines is connected to a control gate of the primary memory cell portion of a respective split-gate memory cell of each string of series-connected split-gate memory cells of the plurality of strings of series-connected split-gate memory cells; and a plurality of assist access lines, wherein each assist access line of the plurality of assist access lines is connected to a control gate of the assist memory cell portion of its respective split-gate memory cell of each string of series-connected split-gate memory cells of the plurality of strings of series-connected split-gate memory cells.

2. The memory of claim 1, wherein, for each split-gate memory cell of the plurality of strings of series-connected split-gate memory cells, the primary memory cell portion of that split-gate memory cell is configured for output of data using a read operation of the memory, and a data state of the assist memory cell portion of that split-gate memory cell is configured to be inaccessible using the read operation.

3. The memory of claim 1, further comprising:
a plurality of data lines, wherein each data line of the plurality of data lines is selectively connected to a respective string of series-connected split-gate memory cell of the plurality of strings of series-connected split-gate memory cells; and
a common source, wherein each string of series-connected split-gate memory cells of the plurality of strings of series-connected split-gate memory cells is selectively connected to the common source.

4. The memory of claim 3, wherein the plurality of strings of series-connected split-gate memory cells is a first plurality of strings of series-connected split-gate memory cells, and wherein the array of memory cells further comprises:
a second plurality of strings of series-connected split-gate memory cells, wherein each split-gate memory cell of the second plurality of strings of series-connected split-gate memory cells comprises a primary memory cell portion and an assist memory cell portion;
wherein each data line of the plurality of data lines is further selectively connected to a respective string of series-connected split-gate memory cell of the second plurality of strings of series-connected split-gate memory cells; and
wherein each string of series-connected split-gate memory cells of the second plurality of strings of series-connected split-gate memory cells is selectively connected to the common source.

5. The memory of claim 4, wherein each primary access line of the plurality of primary access lines is further connected to a control gate of the primary memory cell portion of a respective split-gate memory cell of each string of series-connected split-gate memory cells of the second plurality of strings of series-connected split-gate memory cells, and wherein each assist access line of the plurality of assist access lines is connected to a control gate of the assist memory cell portion of its respective split-gate memory cell of each string of series-connected split-gate memory cells of the second plurality of strings of series-connected split-gate memory cells.

6. The memory of claim 1, wherein, for each split-gate memory cell of the plurality of strings of series-connected split-gate memory cells, the primary memory cell portion of that split-gate memory cell comprises a data-storage structure, and the assist memory cell portion of that split-gate memory cell comprises a data-storage structure.

7. The memory of claim 6, wherein, for each split-gate memory cell of the plurality of strings of series-connected split-gate memory cells, the data-storage structure of the primary memory cell portion of that split-gate memory cell and the data-storage structure of the assist memory cell portion of that split-gate memory cell comprise a continuous dielectric structure.

8. The memory of claim 6, wherein, for each split-gate memory cell of the plurality of strings of series-connected split-gate memory cells, the data-storage structure of the primary memory cell portion of that split-gate memory cell is isolated from the data-storage structure of the assist memory cell portion of that split-gate memory cell.

9. The memory of claim 8, wherein, for each split-gate memory cell of the plurality of strings of series-connected split-gate memory cells, the data-storage structure of the primary memory cell portion of that split-gate memory cell comprises a first conductive structure and the data-storage structure of the assist memory cell portion of that split-gate memory cell comprises a second conductive structure.

10. The memory of claim 1, wherein, for each split-gate memory cell of the plurality of strings of series-connected split-gate memory cells, a channel region of the primary memory cell portion of that split-gate memory cell is in communication with a channel region of the assist memory cell portion of that split-gate memory cell.

11. A memory, comprising:
an array of memory cells comprising a plurality of strings of series-connected split-gate memory cells, wherein each split-gate memory cell of the plurality of strings of series-connected split-gate memory cells comprises a primary memory cell portion and an assist memory cell portion;
a plurality of primary access lines, wherein each primary access line of the plurality of primary access lines is connected to a control gate of the primary memory cell portion of a respective split-gate memory cell of each string of series-connected split-gate memory cells of the plurality of strings of series-connected split-gate memory cells;
a plurality of assist access lines, wherein each assist access line of the plurality of assist access lines is connected to a control gate of the assist memory cell portion of its respective split-gate memory cell of each string of series-connected split-gate memory cells of the plurality of strings of series-connected split-gate memory cells; and
a controller for access of the array of memory cells;
wherein, during an erase operation on the plurality of strings of series-connected split-gate memory cells, the controller is configured to cause the memory to:
actively bias each primary access line of the plurality of primary access lines while applying an erase voltage to each string of series-connected split-gate memory cells of the plurality of strings of series-connected split-gate memory cells; and
electrically float each assist access line of the plurality of assist access lines while applying the erase voltage to each string of series-connected split-gate memory cells of the plurality of strings of series-connected split-gate memory cells.

12. The memory of claim 11, wherein the controller being configured to cause the memory to actively bias each primary access line of the plurality of primary access lines while applying the erase voltage comprises the controller being configured to cause the memory to actively bias a particular primary access line of the plurality of primary access lines with a voltage level configured to remove charge from a data-storage structure of each primary memory cell portion connected to the particular primary access line.

13. The memory of claim 11, wherein the controller being configured to cause the memory to actively bias each primary access line of the plurality of primary access lines while applying the erase voltage comprises the controller being configured to cause the memory to actively bias each primary access line of the plurality of primary access lines with a respective voltage level configured to remove charge from a data-storage structure of each primary memory cell portion connected to that primary access line.

14. The memory of claim 11, wherein, for each split-gate memory cell of the plurality of strings of series-connected split-gate memory cells, the assist memory cell portion of that split-gate memory cell has a positive threshold voltage.

15. The memory of claim 14, wherein, for at least one split-gate memory cell of the plurality of strings of series-connected split-gate memory cells, the primary memory cell portion of that split-gate memory cell has a negative threshold voltage.

16. A memory, comprising:
an array of memory cells comprising a plurality of strings of series-connected split-gate memory cells, wherein each split-gate memory cell of the plurality of strings of series-connected split-gate memory cells comprises a primary memory cell portion and an assist memory cell portion;
a plurality of primary access lines, wherein each primary access line of the plurality of primary access lines is connected to a control gate of the primary memory cell portion of a respective split-gate memory cell of each string of series-connected split-gate memory cells of the plurality of strings of series-connected split-gate memory cells;
a plurality of assist access lines, wherein each assist access line of the plurality of assist access lines is connected to a control gate of the assist memory cell portion of its respective split-gate memory cell of each string of series-connected split-gate memory cells of the plurality of strings of series-connected split-gate memory cells; and
a controller for access of the array of memory cells;
wherein, during a read operation on a selected split-gate memory cell of a particular string of series-connected split-gate memory cells of the plurality of strings of series-connected split-gate memory cells, the controller is configured to cause the memory to:

apply a first voltage level to a selected primary access line of the plurality of primary access lines that is connected to the control gate of the primary memory cell portion of the selected split-gate memory cell, wherein the first voltage level is configured to selectively activate the primary memory cell portion of the selected split-gate memory cell depending upon its data state;
apply a second voltage level to a selected assist access line of the plurality of assist access lines that is connected to the control gate of the assist memory cell portion of the selected split-gate memory cell, wherein the second voltage level is configured to deactivate the assist memory cell portion of the selected split-gate memory cell; and
apply a third voltage level to an unselected assist access line of the plurality of assist access lines that is connected to the control gate of the assist memory cell portion of an unselected split-gate memory cell of the read operation, wherein the third voltage level is configured to activate the assist memory cell portion of the unselected split-gate memory cell.

17. The memory of claim 16, wherein the controller being configured to cause the memory to apply the third voltage level to the unselected assist access line comprises the controller being configured to cause the memory to apply the third voltage level to each assist access line of the plurality of assist access lines other than the selected assist access line.

18. The memory of claim 16, wherein the controller is further configured to cause the memory to apply the third voltage level to an unselected primary access line of the plurality of primary access lines that is connected to the control gate of the primary memory cell portion of the unselected split-gate memory cell, wherein the third voltage level is configured to activate the primary memory cell portion of the unselected split-gate memory cell.

19. The memory of claim 18, wherein the controller being configured to cause the memory to apply the third voltage level to the unselected primary access line comprises the controller being configured to cause the memory to apply the third voltage level to each primary access line of the plurality of primary access lines other than the selected primary access line.

20. The memory of claim 16, wherein, for each split-gate memory cell of the plurality of strings of series-connected split-gate memory cells, the assist memory cell portion of that split-gate memory cell has a positive threshold voltage.

21. The memory of claim 20, wherein, for at least one split-gate memory cell of the plurality of strings of series-connected split-gate memory cells, the primary memory cell portion of that split-gate memory cell has a negative threshold voltage.

* * * * *